United States Patent
Cho et al.

(10) Patent No.: US 10,020,458 B2
(45) Date of Patent: Jul. 10, 2018

(54) WHITE ORGANIC LIGHT-EMITTING DISPLAY DEVICE

(71) Applicant: LG DISPLAY CO., LTD., Seoul (KR)

(72) Inventors: GwiJeong Cho, Daegu (KR); YounSeok Kam, Seoul (KR); TaeSun Yoo, Goyang-si (KR); TaeShick Kim, Yongin-si (KR); SeUng Kim, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 24 days.

(21) Appl. No.: 14/918,166

(22) Filed: Oct. 20, 2015

(65) Prior Publication Data

US 2016/0181563 A1 Jun. 23, 2016

(30) Foreign Application Priority Data

Dec. 18, 2014 (KR) .................. 10-2014-0183569
Jun. 29, 2015 (KR) .................. 10-2015-0092495

(51) Int. Cl.
*H01L 51/50* (2006.01)

(52) U.S. Cl.
CPC ........ *H01L 51/5056* (2013.01); *H01L 51/504* (2013.01); *H01L 51/506* (2013.01); *H01L 51/5024* (2013.01); *H01L 51/5044* (2013.01); *H01L 51/5072* (2013.01)

(58) Field of Classification Search
CPC ............. H01L 51/5024; H01L 51/5044; H01L 51/5072
See application file for complete search history.

(56) References Cited

U.S. PATENT DOCUMENTS

| | | | | |
|---|---|---|---|---|
| 6,531,234 | B1* | 3/2003 | Higashi | H01L 51/0025 252/301.34 |
| 2003/0104242 | A1* | 6/2003 | Aziz | C09K 11/06 428/690 |
| 2003/0118866 | A1* | 6/2003 | Oh | H01L 51/0058 428/690 |
| 2008/0103315 | A1* | 5/2008 | Egawa | C07C 211/61 548/442 |

(Continued)

FOREIGN PATENT DOCUMENTS

| | | |
|---|---|---|
| EP | 2503617 A2 | 9/2012 |
| EP | 2811524 A1 | 12/2014 |

(Continued)

*Primary Examiner* — Kyoung Lee
*Assistant Examiner* — Christina Sylvia
(74) *Attorney, Agent, or Firm* — Birch, Stewart, Kolasch & Birch, LLP

(57) ABSTRACT

A white organic light-emitting display device includes a red emission layer between a charge generation layer and a yellow-green emission layer and having a hole transport-type host. The white organic light-emitting display device can improve brightness, color gamut, and color shift rate since the red emission layer functions as a hole transport layer and an electron blocking layer, as well as an emission layer. The white organic light-emitting display device can further improve the efficiency of the red emission layer by reducing exciton quenching between the charge generation layer and the red emission layer by the insertion of an auxiliary layer composed of a hole transport-type host between the charge generation layer and the red emission layer.

12 Claims, 16 Drawing Sheets

(56) References Cited

U.S. PATENT DOCUMENTS

| | | | |
|---|---|---|---|
| 2008/0171226 A1* | 7/2008 | Noh | H01L 51/5044 |
| | | | 428/690 |
| 2010/0187552 A1* | 7/2010 | Lee | H05B 33/10 |
| | | | 257/98 |
| 2010/0237338 A1* | 9/2010 | Yamamoto | H01L 51/5036 |
| | | | 257/40 |
| 2011/0133227 A1* | 6/2011 | Lee | H01L 51/5036 |
| | | | 257/89 |
| 2014/0070196 A1* | 3/2014 | Kim | H01L 51/504 |
| | | | 257/40 |
| 2014/0124766 A1* | 5/2014 | Song | H01L 51/5004 |
| | | | 257/40 |
| 2014/0291631 A1* | 10/2014 | Lee | H01L 51/508 |
| | | | 257/40 |
| 2015/0279909 A1 | 10/2015 | Tsuji et al. | |

FOREIGN PATENT DOCUMENTS

| | | |
|---|---|---|
| GB | 2497427 A | 6/2013 |
| JP | 2004-6165 A | 1/2004 |
| WO | WO 2009/028832 A2 | 3/2009 |
| WO | WO 2014/068970 A1 | 5/2014 |

* cited by examiner

WHITE ORGANIC LIGHT-EMITTING DISPLAY DEVICE

CROSS-REFERENCE TO RELATED APPLICATION

Pursuant to 35 U.S.C. § 119(a), this application claims the benefit of earlier filing date and right of priority to Korean Application Nos. 10-2014-0183569, filed on Dec. 18, 2014, and 10-2015-0092495, filed on Jun. 29, 2015. The contents of all these applications are incorporated by reference herein in their entireties.

BACKGROUND OF THE INVENTION

Field of the Disclosure

The present invention relates to a white organic light-emitting display device, and more particularly, to a white organic light-emitting display device having an n (≥2) stack structure.

Background of the Disclosure

With the increasing interest in information displays and the growing demand for portable information media, a lot of focus is being put on the research and commercialization of thin, lightweight displays.

Among these displays, liquid crystal display devices are a type of display that is getting attention due to their lightweight design and low power consumption.

There is another type of display, i.e., organic light-emitting display devices, which has a wider viewing angle and a higher contrast ratio than the liquid crystal display devices because they are self-luminous. Moreover, the organic light-emitting display devices can be made thinner and lighter and consume less power, because they work without a backlight. Also, the organic light-emitting display devices run on low-voltage direct current, and have fast response time.

Hereinafter, a basic structure and operating characteristics of an organic light-emitting display device will be described in detail with reference to the drawings.

FIG. 1 is a diagram for explaining the principle of electroluminescence of a general organic light-emitting diode.

An organic light-emitting display device generally has an organic light-emitting diode having the structure shown in FIG. 1.

Referring to FIG. 1, the organic light-emitting diode includes an anode 30*f* as a common electrode, a cathode 30*g* as a common electrode, and organic layers 30*a*, 30*b*, 30*c*, 30*d*, and 30*e* formed between them.

The organic layers 30*a*, 30*b*, 30*c*, 30*d*, and 30*e* include a hole transport layer (HTL) 30*b*, an electron transport layer (ETL) 30*d*, and an emission layer (EML) 30*c* interposed between the hole transport layer 30*b* and the electron transport layer 30*d*.

To improve luminous efficiency, a hole injection layer (HIL) 30*a* is interposed between the anode 30*f* and the hole transport layer 30*b*, and an electron injection layer (EIL) 30*e* is interposed between the cathode 30*g* and the electron transport layer 30*d*.

In the organic light-emitting diode thus constructed, when a positive (+) voltage and a negative (−) voltage are applied to the anode 30*f* and the cathode 30*g*, respectively, then holes passed through the hole transport layer 30*b* and electrons passed through the electron transport layer 30*d* move to the emission layer 30*c* to form excitons. When the excitons make a transition from an excited state to the ground state, i.e., stable state, light is emitted at a predetermined wavelength.

In the organic light-emitting display device, sub-pixels are arranged in a matrix, each sub-pixel including the organic light-emitting diode with the above structure. The sub pixels are selectively controlled by a data voltage and a scan voltage, to display an image.

The organic light-emitting display device is categorized as a passive-matrix display or an active-matrix display using a thin film transistor as a switching element. In the active-matrix display, a sub-pixel is selected by selectively turning on its thin film transistor, i.e., active element, and the sub-pixel keeps emitting light by the voltage sustained at the storage capacitor.

Other types of organic light-emitting display include a white organic light-emitting display device that emits white light using at least two emission layers. Since the white organic light-emitting display device emits white light, it has color filters for converting white light to red, green, or blue light.

The organic light-emitting display device that emits white light may have a structure composed of two emission layers of complementary colors. In this structure, when white light passes through the color filters, the range of colors that can be reproduced becomes narrower due to the difference between the wavelength region of the emission peak in each emission layer and the transmission region of the color filters, which makes it difficult to achieve a desired color gamut.

For example, in the case of an organic light-emitting display device that includes a blue emission layer and a yellow-green emission layer and emits white light, white light is emitted while generating emission peak wavelengths at a blue wavelength region and a yellow-green wavelength region. However, when the white light passes through the red, green, and blue color filters, the transmittance of the blue wavelength region becomes lower than those of the red or green wavelength regions, resulting in a decrease in luminous efficiency and color gamut. Also, the blue emission layer is formed of a fluorescent light-emitting material, and the yellow emission layer is formed of a phosphorescent light-emitting material, and this leads to a difference in efficiency between the yellow phosphorescent emission layer and the blue fluorescent emission layer because the yellow phosphorescent layer has a higher luminous efficiency than the blue fluorescent emission layer, resulting in a decrease in luminous efficiency and color gamut.

SUMMARY OF THE DISCLOSURE

The present invention is directed to a white organic light-emitting display device having an n (≥2) stack structure which improves brightness, color gamut, and color shift rate.

Other aspects and features of the present disclosure will become apparent from the following description of this invention and the appended claims.

To achieve these and other advantages and in accordance with the purpose of this specification, as embodied and broadly described herein, a white organic light-emitting display device comprises: a first light-emitting part over a first electrode, and the first light-emitting part including a blue emission layer; a first charge generation layer over the first light-emitting part; a second light-emitting part over and contacting the first charge generation layer, the second light-emitting part including a red emission layer and a yellow-green emission layer; and a second electrode over the second light-emitting part.

The red emission layer may include at least one hole-transport type host with a hole transport property, and the hole-transport type host may function as a hole transport layer.

The white organic light-emitting display device may further include a third light-emitting part over the second light-emitting part, the third light-emitting part including a blue emission layer.

The white organic light-emitting display device may further include a second charge generation layer between the second light-emitting part and the third light-emitting part.

The first light-emitting part may further include a first hole transport layer between the first electrode and the blue emission layer; and a first electron transport layer between the blue emission layer and the first charge generation layer.

The second light-emitting part may further include a second electron transport layer between the yellow-green emission layer and the second electrode.

The red emission layer may be over the first charge generation layer, without a hole transport layer in between the first charge generation layer and the yellow-green emission layer.

The white organic light-emitting display device may further include an auxiliary layer between the first charge generation layer and the red emission layer, and the auxiliary layer having a hole transport property.

The auxiliary layer may include a hole transport-type host.

The red emission layer may include a red dopant with a doping concentration of 0.5 to 10%.

The red emission layer may include the hole transport-type host, at least one other host, and one or more dopants.

The thickness ratio of the hole transport-type host and the at least one other host may be between 0:1 to 1:0.

In another aspect, a white organic light-emitting display device comprises: a first light-emitting part over a first electrode, and the first light-emitting part including a first hole transport layer, a first emission layer, and a first electron transport layer; a second light-emitting part over the first light-emitting part, and the second light-emitting part including a second emission layer with a hole transport function and a second electron transport layer; a third light-emitting part over the second light-emitting part, and the third light-emitting part including a second hole transport layer, a third emission layer, and a third electron transport layer; and a second electrode over the third light-emitting part.

The second emission layer may include two emission layers, the two emission layers having a red emission layer and a yellow-green emission layer.

The red emission layer may have a hole transport function, and the second light-emitting part may have no hole transport layer.

The red emission layer may include at least two hosts and a dopant, and at least one of the two hosts may be a hole transport-type host having a hole transport function.

The white organic light-emitting display device may further include a first charge generation layer between the first light-emitting part and the second light-emitting part.

The second emission layer may be over the first charge generation layer.

The white organic light-emitting display device may further include an auxiliary layer between the first charge generation layer and the second emission layer, and the auxiliary layer having a hole transport property.

The auxiliary layer may include a hole transport-type host.

As described above in detail, in the white organic light emitting display device according to an exemplary embodiment of the present invention, the red emission layer serves both as an emission layer and a hole transport layer for transferring holes to the yellow-green emission layer. Accordingly, brightness, color gamut, and color shift rate angle can be improved.

Furthermore, in the white organic light emitting display device according to an exemplary embodiment of the present invention, the dopant contained in the red emission layer allows for trapping of electrons leaking from the yellow-green emission layer, and this contributes to electron-hole emission, leading to red light emission as well as yellow-green light emission and thereby increasing red efficiency and contributing to improvement in panel brightness.

Furthermore, in the white organic light emitting display device according to another exemplary embodiment of the present invention, if an auxiliary layer composed of a hole transport-type host is added between the charge generation layer and the red emission layer, holes may be transferred to the yellow-green emission layer, thus improving efficiency, and the probability of quenching between the P-type charge generation layer and the red emission layer may be decreased, thus further improving red efficiency.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE EMBODIMENTS OF INVENTION

Figure 1:
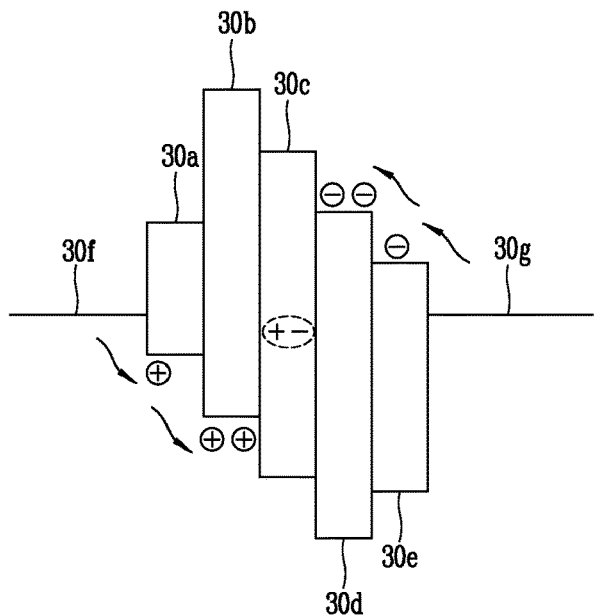
FIG. 1 is a diagram for explaining the principle of electroluminescence of a general organic light-emitting diode.

Description will now be given below in detail of certain embodiments of white organic light-emitting display devices according to the present invention, with reference to the accompanying drawings.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the scope of the inventive concept to those skilled in the art, and the present inventive concept will only be defined by the appended claims. Like reference numerals refer to like elements throughout the specification. In the drawings, sizes and relative sizes of layers and regions may be exaggerated for clarity.

It will be understood that when an element or layer is referred to as being "on" or "over" another element or layer, the element or layer can be directly on another element or layer or intervening elements or layers may also be present. In contrast, when an element is referred to as being "directly on" or "directly over" another element or layer, there are no intervening elements or layers present.

Spatially relative terms, such as "beneath," "below," "lower," "above," "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated components, steps, operations, and/or components, but do not preclude the presence or addition of one or more other components, steps, operations, and/or components thereof.

Figure 2:
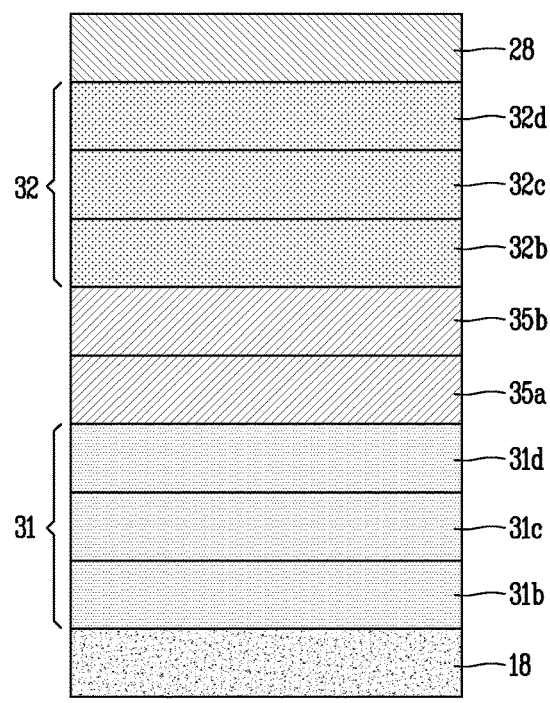
FIG. 2 is an illustration schematically showing a structure of an organic light-emitting diode according to an exemplary embodiment of the present invention.

FIG. 2 is an illustration schematically showing a structure of an organic light-emitting diode according to an exemplary embodiment of the present invention.

By way of example, FIG. 2 shows an organic light-emitting diode having a 2-stack, 2-peak structure.

Figure 3:
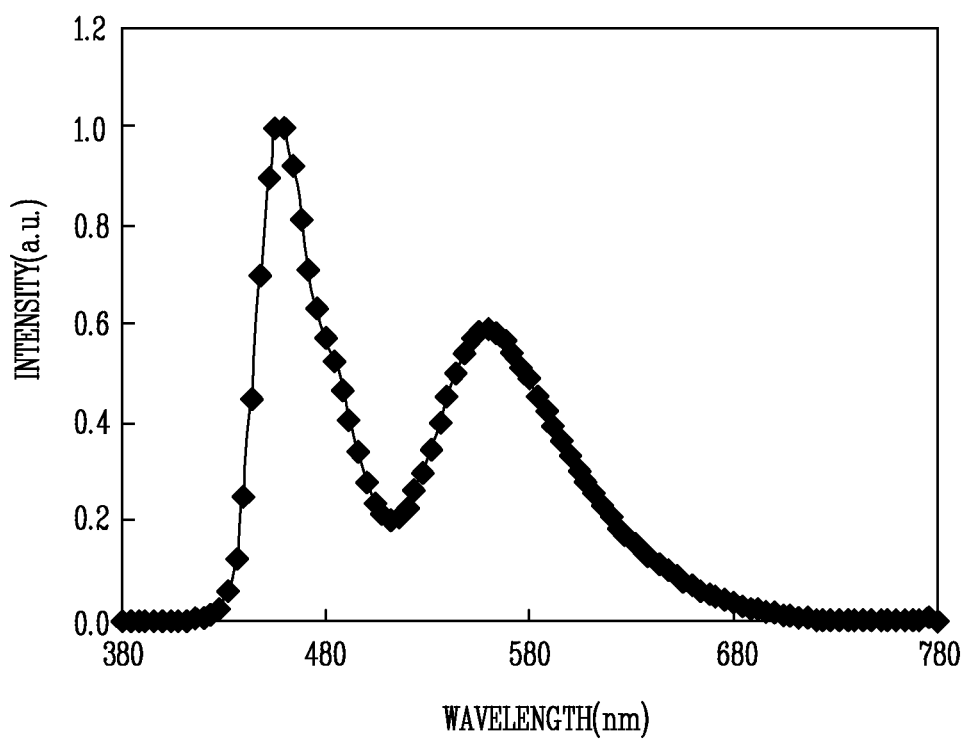
FIG. 3 is a graph showing the light intensity vs. wavelength of a white organic light-emitting display device according to the exemplary embodiment of the present invention.

FIG. 3 is a graph showing, by way of example, the light intensity vs. wavelength of a white organic light-emitting display device according to the exemplary embodiment of the present invention.

Referring to FIG. 2, a light-emitting part is between a first electrode 18 and a second electrode 28, and includes a first light-emitting part 31 and a second light-emitting part 32.

An N-type charge generation layer 35a and a P-type charge generation layer 35b are between the first light-emitting part 31 and the second light-emitting part 32. In the case of a light-emitting part including two light-emitting parts, the charge generation layers 35a and 35b adjust the balance of charges between the first light-emitting part 31 and the second light-emitting part 32.

In this case, a plurality of transport layers and buffer layers may be provided in the first light-emitting part 31 and the second light-emitting part 32 to enhance efficiency and lifetime.

For example, the first light-emitting part 31 can include a first hole transport layer 31b, a blue emission layer 31c, and a first electron transport layer 31d. The second light-emitting part 32 can include a second hole transport layer 32b, a yellow-green emission layer 32c, and a second electron transport layer 32d.

The white organic light-emitting display device of this type may have a lower efficiency and a smaller color gamut due to the absence of a red emission layer. That is, the above-described organic light-emitting display device emits white light using blue-peak light and yellow-green peak light and passes the white light through red, green, and blue color filters to display an image, and may have a lack of red efficiency due to the absence of a red emission layer.

As illustrated in FIG. 3, the blue emission layer shows a light intensity in a wavelength region of 440 nm to 480 nm, and the yellow-green emission layer shows a light intensity in a wavelength region of 510 nm to 590 nm. However, no peak of the light intensity is observed at wavelengths of 600 nm to 650 nm corresponding to a red wavelength region. This implies the lack of red efficiency.

In view of this, high current is required to obtain high brightness, and this results in an increase in power consumption. Also, if more layers are added to improve efficiency, this involves additional processes, causing a rise in cost.

In this regard, the present inventors conducted numerous tests to improve red efficiency. Through these tests, the present inventors devised an organic light-emitting display device with a novel structure which improves efficiency and color gamut. This organic light-emitting display device will be described with reference to the following exemplary embodiments.

Figure 4:
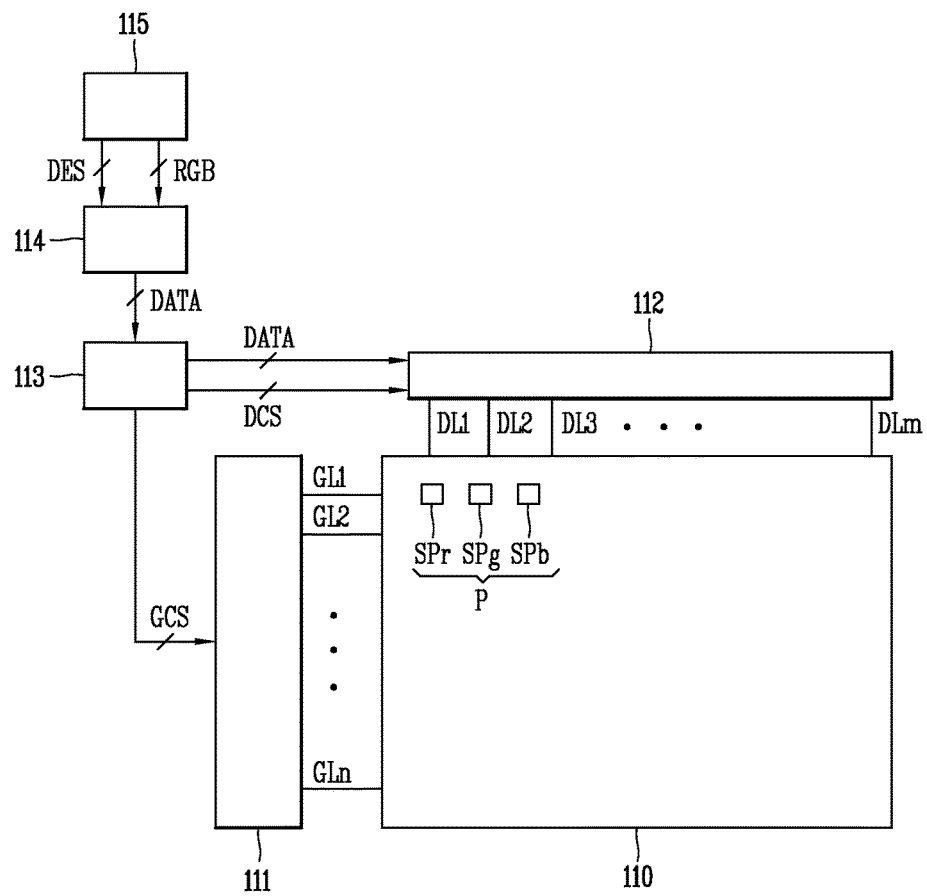
FIG. 4 is a block diagram schematically showing a white organic light-emitting display device according to the exemplary embodiment of the present invention.

FIG. 4 is a block diagram schematically showing a white organic light-emitting display device according to the exemplary embodiment of the present invention. All the components of the white organic light-emitting display devices of the present invention are operatively coupled and configured.

Referring to FIG. 4, the white organic light-emitting display device according to the exemplary embodiment of the present invention may include an image processor 115, a data converter 114, a timing controller 113, a data driver 112, a gate driver 111, and a display panel 110.

The image processor 115 performs various image processing tasks using an RGB data signal (RGB), including setting a gamma voltage to attain maximum brightness according to average picture level, and then outputs the RGB data signal (RGB). In addition to the RGB data signal (RGB), the image processor 115 outputs driving signals including at least one among a vertical synchronization signal Vsync, a horizontal synchronization signal Hsync, a data enable signal DES, and a clock signal CLK.

The timing controller 113 receives, from the image processor 115 or data converter 114, driving signals including one or more among the vertical synchronization signal Vsync, horizontal synchronization signal Hsync, data enable signal DES, and clock signal CLK. The timing controller 113 outputs a gate timing control signal GCS for controlling operation timing of the gate driver 111 and a data timing control signal DCS for controlling operation timing of the data driver 112, based on a driving signal.

The timing controller 113 outputs a data signal DATA corresponding to the gate timing control signal GCS and data timing control signal DCS.

The data driver 112 samples and latches the data signal DATA supplied from the timing controller 113, in response to the data timing control signal DCS supplied from the timing controller 113, and converts it to a gamma reference voltage and outputs the gamma reference voltage. The data driver 112 outputs the converted data signal DATA through data lines DL1 to DLm. The data driver 112 is formed in the form of an integrated circuit (IC).

The gate driver 112 outputs a gate signal while shifting the level of a gate voltage in response to the gate timing control signal GCS supplied from the timing controller 113. The gate driver 111 outputs the gate signal through gate lines GL1 to GLn. The gate driver 111 is formed in the form of an IC, or formed on the display panel 150 using the gate-in-panel (GIP) technology.

For example, the display panel 110 may have a sub-pixel structure including a red sub-pixel SPr, a green sub-pixel SPg, and a blue sub-pixel (SPb). That is, each pixel P includes RGB sub-pixels SPr, SPg, and SPb. However, the present invention is not limited to this example, and each pixel may further include a white sub-pixel.

Figure 5:
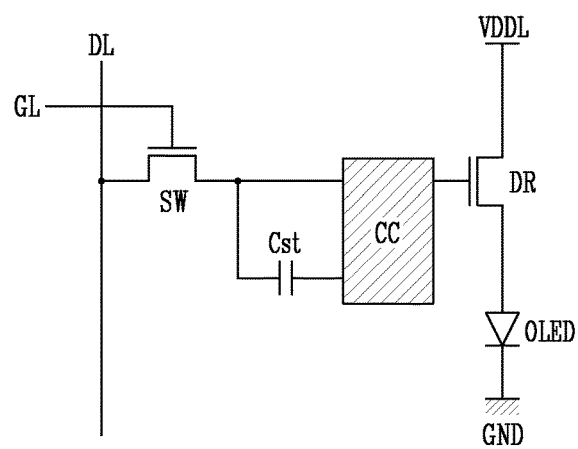
FIG. 5 is an illustration showing the circuit configuration of a sub-pixel of an organic light-emitting display device.

FIG. 5 is an illustration showing the circuit configuration of a sub-pixel of an organic light-emitting display device according to an embodiment of the present invention.

The sub-pixel illustrated in FIG. 5 has, by way of example, a 2T (two transistors) 1C (one capacitor) structure including a switching transistor, a driving transistor, a capacitor, and an organic light-emitting diode. However, the present invention is not limited to this example, and the sub-pixel may have various structures such as 3T1C (three transistors and one capacitor), 4T2C (four transistors and two capacitors), and 5T2C (five transistors and two capacitors) as long as a compensation circuit is added.

Referring to FIG. 5, in the organic light-emitting display device, a sub-pixel region is defined by a gate line GL arranged in a first direction, a data line DL arranged at intervals in a second direction perpendicular to the first direction, and a driving power line VDDL.

A sub-pixel may include a switching transistor SW, a driving transistor DR, a capacitor Cst, a compensation circuit CC, and an organic light-emitting diode OLED. The organic light-emitting diode OLED operates to emit light by a driving current formed by the driving transistor DR.

The switching transistor SW operates as a switch to store a data signal supplied through the data line DL as a data voltage in the capacitor Cst, in response to a gate signal supplied through the gate line GL. The driving transistor DR operates to allow a driving current to flow between the driving power line VDDL and a grounding wire GND by the data voltage stored in the capacitor Cst.

The compensation circuit CC compensates a threshold voltage, etc of the driving transistor DR. The compensation circuit CC may include one or more transistors and a capacitor. The compensation circuit CC may be configured in various ways, so a concrete example and description thereof will be omitted.

The organic light-emitting display device having the above sub-pixel structure may be formed as top-emission type, bottom-emission type, or dual-emission type, depending on the direction of light emission.

Figure 6:
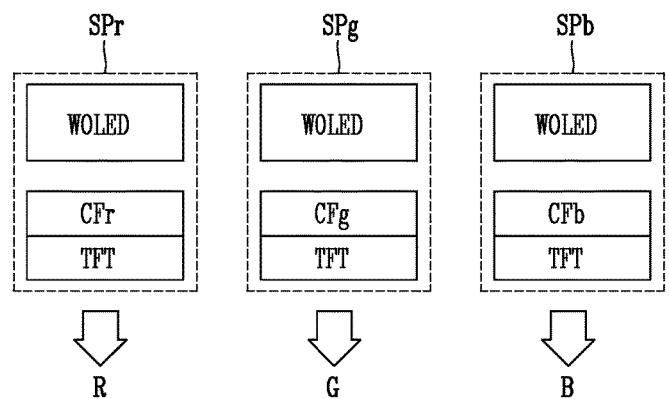
FIG. 6 is an illustration showing a schematic structure of a sub-pixel in the white organic light-emitting display device of FIG. 4 according to the exemplary embodiment of the present invention.

FIG. 6 is an illustration showing a schematic structure of a sub-pixel in the white organic light-emitting display device of FIG. 4 according to the exemplary embodiment of the present invention.

Referring to FIG. 6, RGB sub-pixels SPr, SPg, and SPb may be rendered by using a white organic light-emitting diode WOLED and color filters CFr, CFg, and CFb, or by using light-emitting materials of red, green, and blue for the organic light-emitting diode.

A sub-pixel rendering method using the white organic light-emitting diode WOLED and the color filters CFr, CFg, and CFb will be described below.

The RGB sub-pixels SPr, SPg, and SPb each include a transistor TFT, an RGB color filter CFr, CFg, and CFb, and a white organic light-emitting diode WOLED. That is, the RGB sub-pixels SPr, SPg, and SPb include RGB color filters CFr, CFg, and CFb to convert white light from the white organic light-emitting diode OLED to red, green, and blue light.

In the sub-pixel rendering method using the white organic light-emitting diode WOLED and the color filters CFr, CFg, and CFb, multiple layers of light-emitting materials are equally deposited on all the sub-pixels, unlike a sub-pixel rendering method in which red, green, and blue light-emitting materials are respectively deposited on the sub-pixels. Accordingly, this method allows for larger display sizes, higher lifetime, and lower power consumption, even without the use of a fine metal mask (FMM).

Figure 7:
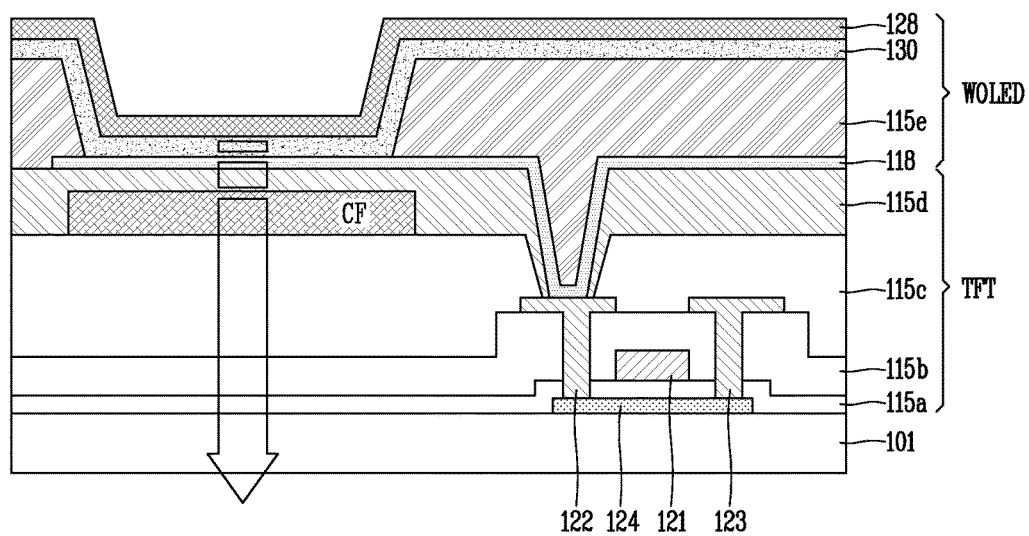
FIG. 7 is a cross-sectional view schematically showing a part of the sub-pixel in the white organic light-emitting display device according to the exemplary embodiment of the present invention.

FIG. 7 is a cross-sectional view schematically showing a part of the sub-pixel in the white organic light-emitting display device according to the exemplary embodiment of the present invention.

By way of example, the organic light-emitting display device illustrated in FIG. 7 is a bottom-emission type organic light-emitting display device that emits light in the direction of a substrate where pixels are arranged. However, the present invention is not limited to this example, but may be applicable to a dual-emission type organic light-emitting display device, as well as a top-emission type organic light-emitting display device that emits light in the opposite direction of the substrate with pixels arranged on it.

By way of example, FIG. 7 shows an organic light-emitting display device using a thin film transistor having a coplanar structure. However, the present invention is not limited to the thin film transistor having a coplanar structure, but may be applicable to a thin film transistor having a staggered structure.

Figure 8:
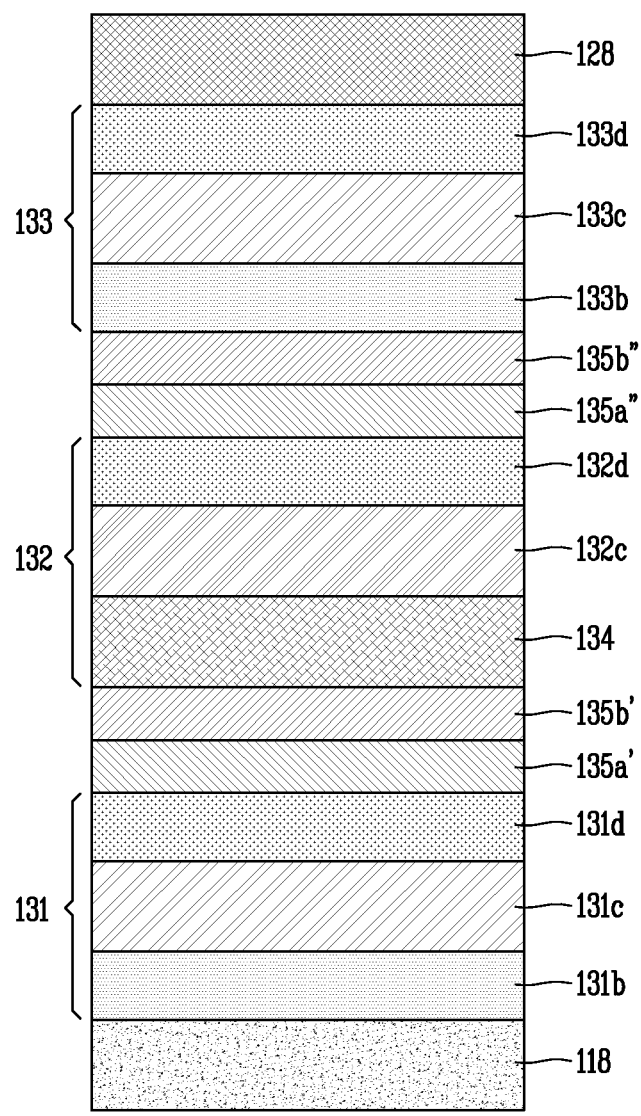
FIG. 8 is an illustration schematically showing a structure of an organic light-emitting diode in the white organic light-emitting display device of FIG. 7 according to the exemplary embodiment of the present invention.

FIG. 8 is an illustration schematically showing a structure of an organic light-emitting diode in the white organic light-emitting display device of FIG. 7 according to the exemplary embodiment of the present invention.

Referring to FIG. 7, in the white organic light-emitting display device according to the exemplary embodiment of the present invention, a sub-pixel may include a transistor TFT, a white organic light-emitting diode WOLED, and a color filter CF that are formed over a substrate 101.

First, a driving thin film transistor used as the transistor TFT includes a semiconductor layer 124, a gate electrode 121, a source electrode 122, and a drain electrode 123.

The semiconductor layer 124 is formed on the substrate 101 formed of an insulating material such as transparent plastic or polymer film. The semiconductor layer 124 may be composed of a polycrystalline silicon film, formed by crystallization of an amorphous silicon film or amorphous silicon, an oxide semiconductor, or an organic semiconductor.

In this case, a buffer layer may be further formed between the substrate 101 and the semiconductor layer 124. The buffer layer may be formed to protect the transistor TFT formed in a subsequent process from impurities such as alkali ions leaking from the substrate 101.

A gate insulation film 115a formed of silicon oxide (SiOx), silicon nitride (SiNx), or the like is formed over the semiconductor layer 124. Then, a gate line including a gate electrode 121, and a first storage electrode are formed over the gate insulation film 115a.

The gate electrode 121, gate line, and first storage electrode may be formed of a single layer or multiple layers formed of a low-resistance first metal material, e.g., aluminum (Al), copper (Cu), molybdenum (Mo), chrome (Cr), gold (Au), titanium (Ti), nickel (Ni), neodymium (Nd), or alloys thereof.

An interlayer insulation film 115b composed of a silicon nitride film or a silicon oxide film may be formed over the gate electrode 121, gate line, and first storage electrode. Then, a data line, a driving voltage line, source/drain electrodes 122 and 123, and a second storage electrode (not shown) are formed over the interlayer insulation film 115b.

The source electrode 122 and the drain electrode 123 are formed at predetermined intervals, and electrically connected to the semiconductor layer 124. More specifically, semiconductor contact holes exposing the semiconductor layer 124 are formed in the gate insulation film 115a and the interlayer insulation film 115b, and the source/drain electrodes 122 and 123 are electrically connected to the semiconductor layer 124 via the semiconductor contact holes.

In this case, the second storage electrode overlaps part of the underlying first storage electrode, with the interlayer insulation film 115b between them, to form a storage capacitor.

The data line, driving voltage line, source/drain electrodes 122 and 123, and second storage electrode may be formed of a single layer or multiple layers formed of a low-resistance second metal material, e.g., aluminum (Al), copper (Cu), molybdenum (Mo), chrome (Cr), gold (Au), titanium (Ti), nickel (Ni), neodymium (Nd), or alloys thereof.

A passivation film (or planarization film) 115c is formed over the substrate 101 where the data line, driving voltage line, source/drain electrodes 122 and 123, and second storage electrode are formed.

The color filter CF is formed over the passivation film 115c. The color filter CF is a color conversion material that converts white light from the white organic light-emitting diode WOLED to red, green, or blue light.

An overcoating layer 115d is formed over the passivation film 115c to cover the color filter CF and exposes part of the drain electrode 123. The overcoating layer 115d may be formed of an organic material, an inorganic material, or a mixture of organic and inorganic materials.

Next, the white organic light-emitting diode WOLED may include a first electrode 118, a light-emitting part 130, and a second electrode 128.

In this case, the light-emitting part 130 according to the exemplary embodiment of the present invention has an n (≥2) stack structure including at least one blue emission layer and at least one yellow-green emission layer, and has three peaks. This will be described later in detail.

The white organic light-emitting diode WOLED is electrically connected to the driving thin film transistor. More specifically, a drain contact hole exposing the drain electrode 123 of the driving thin film transistor is formed in the passivation film 115c and overcoating layer 115d formed in the upper part of the driving thin film transistor. The white organic light-emitting diode WOLED is electrically connected to the drain electrode 123 of the driving thin film transistor via the drain contact hole.

That is, the first electrode 118 is formed over the overcoating layer 115d, and electrically connected to the drain electrode 123 of the driving thin film transistor via the drain contact hole.

The first electrode 118 supplies a current (or voltage) to the light-emitting part 130.

Also, the first electrode 118 serves as an anode. Accordingly, the first electrode 118 may be formed of a transparent conductive material having a relatively high work function, for example, indium tin oxide (ITO) or indium zinc oxide (IZO). However, the present invention is not limited to these materials.

A bank 115e is formed over the substrate 101 where the first electrode 118 is formed. In this case, the bank 115e defines an opening by enclosing the edge of the first electrode 118, and may be formed of an organic insulating material.

The bank 115e may be formed of a photosensitizer including a black pigment. In this case, the bank 115e may serve as a light blocking member.

The light-emitting part 130 and the second electrode 128 are formed over the substrate 101 where the bank 115e is formed.

That is, the light-emitting part 130 is formed between the first electrode 118 and the second electrode 128. The light-emitting part 130 emits light by the combination of a hole supplied from the first electrode 118 and an electron supplied from the second electrode 128.

The light-emitting part 130 may have a multilayer structure including multiple organic layers for enhancing the luminous efficiency of an emission layer, in addition to the emission layer.

The organic light-emitting diode is fabricated to have a multilayer thin film structure, because the use of a hole transport layer and an electron transport layer may facilitate the transfer of holes and electrons to the emission layers due to the large difference in mobility between the holes and electrons of an organic material, and because luminous efficiency may be increased by balancing hole and electron densities within the emission layer. Also, an electron injected into the emission layer from the second electrode 128 is trapped in an energy barrier presented at the interface of the hole transport layer and the emission layer, and this increases the rate of recombination of electrons and holes, thus resulting in higher efficiency.

The light-emitting part 130 may be provided in the form of a single layer that extends across all the pixels. The light-emitting part 130 may include an organic light-emitting material that produces white light. In this case, each sub-pixel has a color filter CF to represent various colors.

In another example, the light-emitting part 130 may be provided separately for each sub-pixel. In this case, the light-emitting part 130 may include an organic light-emitting material that produces either red, green, or blue light for each sub-pixel.

The second electrode 128 is formed over the light-emitting part 130 to supply electrons to the light-emitting part 130. The second electrode 128 may be formed to cover the entire substrate 101. That is, while the first electrode 118 is provided separately for each sub-pixel, the second electrode 128 may be provided in the form of a single layer that extends across all the pixels. However, the present invention is not limited to this configuration.

In this case, the white organic light-emitting display device according to the exemplary embodiment of the present invention features an n (≥2) stack structure, for example, a 3-stack, 3-peak structure in which a second light-emitting part and a third light-emitting part are located over a first light-emitting part. However, the present invention is not limited to the 3-stack structure to be described later.

Moreover, in the white organic light-emitting display device according to the exemplary embodiment of the present invention, a red emission layer having a hole-transport type host is located within the second light-emitting part, specifically, between a charge generation layer and a yellow-green emission layer.

Referring to FIG. 8, an organic light-emitting diode having a 3-stack, 3-peak structure according to the exemplary embodiment of the present invention includes a first electrode 118, a second electrode 128, and a light-emitting part between the first electrode 118 and the second electrode 128.

The light-emitting part may include a first light-emitting part 131, a second light-emitting part 132, and a third light-emitting part 133.

In this case, a first N-type charge generation layer 135a' and a first P-type charge generation layer 135b' may be between the first light-emitting part 131 and the second light-emitting part 132. A second N-type charge generation layer 135a" and a second P-type charge generation layer 135b" may be between the second light-emitting part 132 and the third light-emitting part 133.

In this case, the first N-type charge generation layer 135a' serves to inject electrons into the first light-emitting part 131, and the first P-type charge generation layer 135b' serves to inject holes into the second light-emitting part 132. Likewise, the second N-type charge generation layer 135a" serves to inject electrons into the second light-emitting part 132, and the second P-type charge generation layer 135b" serves to inject holes into the third light-emitting part 133.

Various types of organic materials with strong electron donor and acceptor properties may be used as the charge generation layers 135a', 135a", 135b', and 135b".

In an example, the P-type charge generation layers 135b' and 135b" may have a HAT-CN (Dipyrazino[2,3-f:2',3'-h] quinoxaline-2,3,6,7,10,11-hexacarbonitrile) or P-doped structure. Also, the charge generation layers 135a', 135a", 135b', and 135b" may be composed of a single layer such as HAT-CN.

In the case of a light-emitting part including three stacks, the first charge generation layers 135a' and 135b' adjust the balance of charges between the first light-emitting part 131 and the second light-emitting part 132, and the second charge generation layers 135a" and 135b" adjust the balance of charges between the second light-emitting part 132 and the third light-emitting part 133. However, as stated above, the present invention is not limited to the three light-emitting parts.

The first light-emitting part 131 may include a first hole transport layer 131b, a blue emission layer 131c, and a first electron transport layer 131d. Each layer included in the first light-emitting part 131 is over the first electrode 118.

The blue emission layer 131c is an emission layer that includes a blue dopant and a host and emits blue light. A deep blue emission layer or a sky blue emission layer may substitute for the blue emission layer 131c. The blue emission layer 131c may have a wavelength range of 440 nm to 480 nm. The blue emission layer 131c may emit either fluorescent light or phosphorescent light.

The blue emission layer 131c may include at least one host, i.e., a mixed host, and at least one dopant. Specifically, the blue emission layer 131c may be composed of, but not necessarily limited to, at least one fluorescent host material among an anthracene derivative, a pyrene derivative, and a perylene derivative, to which a fluorescent blue dopant is added.

Depending on the configuration of the device, a first hole injection layer may further include between the first electrode 118 and the first hole transport layer 131b. Also, a first electron injection layer may further include between the first electron transport layer 131d and the first charge generation layers 135a' and 135b'.

The first hole transport layer 131b may be composed of a single layer or two layers. The second light-emitting part 132 may include a red emission layer 134, a yellow-green emission layer 132c, and a second electron transport layer 132d. Each layer included in the second light-emitting part 132 is over the first charge generation layers 135a' and 135b'.

The yellow-green emission layer 132c may include at least one host, i.e., a mixed host, and at least one dopant. The yellow-green emission layer 132c may be composed of a phosphorescent host material of carbazole compound or metal deposit, to which a phosphorescent yellow-green dopant is added. The carbazole compound may include CBP (4,4'-bis(carbazol-9-yl)-biphenyl), a CBP derivative, mCP (N,N'-dicarbazolyl-3,5-benzene), or an mCP derivatives. The metal deposit may include a ZnPBO (phenyloxazole) metal deposit or a ZnPBT (phenylthiazole) metal deposit. The yellow-green emission layer 132c may have a wavelength range of 510 nm to 590 nm. The yellow-green emission layer 132c is an emission layer that includes at least one dopant and at least one host and emits yellow-green light, the at least one dopant including a yellow-green dopant.

Depending on the configuration of the device, a second electron injection layer may further include between the second electron transport layer 132d and the second charge generation layers 135a" and 135b".

The third light-emitting part 133 may include a third hole transport layer 133b, a blue emission layer 133c, and a third electron transport layer 133d. Each layer included in the third light-emitting part 133 is over the second charge generation layers 135a" and 135b".

Depending on the configuration of the device, a third hole injection layer may further include between the second charge generation layers 135a" and 135b" and the third hole transport layer 133b, and a third electron injection layer may further include between the third electron transport layer 133d and the second electrode 128.

The third hole transport layer 133b may be composed of a single layer or two layers.

A deep blue emission layer or a sky blue emission layer may substitute for the blue emission layer 133c. The blue emission layer 133c may have a wavelength range of 440 nm to 480 nm.

The blue emission layer 133c may emit either fluorescent light or phosphorescent light. The blue emission layer 133c may include at least one host, i.e., a mixed host, and at least one dopant. Specifically, the blue emission layer 133c may be composed of, but not necessarily limited to, at least one fluorescent host material among an anthracene derivative, a pyrene derivative, and a perylene derivative, to which a fluorescent blue dopant is added.

Accordingly, white light may be produced from a combination of blue light from the blue emission layers 131c and 133c and yellow-green light from the yellow-green emission layer 132c. The present invention may produce full white light because the red emission layer 134 provided in the light-emitting part 132, in addition to the blue emission layers 131c and 133c and the yellow-green emission layer 132c, makes up for the lack of red efficiency. That is, the red emission layer 134 of this invention has a wavelength spectrum of 600 to 650 nm, and therefore white light produced by the white organic light-emitting diode of this invention has a wide wavelength range of 440 to 650 nm.

Moreover, the present invention has a 3-peak structure with three emission peaks by the use of the red emission layer 134. The three emission peaks may have a wavelength of 440 to 480 nm corresponding to a blue region, a wavelength of 510 to 590 nm corresponding to a yellow-green region, and a wavelength of 600 to 650 nm corresponding to a red region, respectively. Accordingly, the organic light-emitting display device may improve red efficiency, color gamut, and color shift rate.

In addition, light emitted from the yellow-green emission layer 132 is highly visible and this may improve the visual sensitivity to white light produced by the white organic light-emitting diode of the present invention.

For reference, the blue emission layers 131c and 133c, the red emission layer 134, and the yellow-green emission layer 132c may be formed by a vacuum thermal deposition process. The vacuum thermal deposition process is a method of depositing an organic material on a substrate by placing an organic material of a desired color into a deposition source with an outlet and heating the deposition source within a vacuum chamber to evaporate the organic material and discharge it through the outlet.

In this way, the white organic light-emitting display device according to the exemplary embodiment of the present invention includes the three light-emitting parts 131, 132, and 133. The charge generation layers 135a', 135a", 135b', and 135b" are formed between the three light-emitting parts 131, 132, and 133.

However, the present invention is not limited to this 3-stack structure, and as stated above, the present invention may be applicable to an n-stack structure with 2 stacks, 4-stack, or more.

Particularly, in the white organic light-emitting display device according to the exemplary embodiment of the present invention, the red emission layer 134 is between the first charge generation layers 135a' and 135b' and the yellow-green emission layer 132c of the second light-emitting part 132, without a second hole transport layer or buffer layer in between.

That is, the red emission layer 134 of the present invention is provided not in an additional light-emitting part, but in the second light-emitting part 132 with the yellow-green emission layer 132c.

Moreover, the red emission layer 134 according to the exemplary embodiment of the present invention may substitute for the second hole transport layer. That is, the red emission layer 134 according to the exemplary embodiment of the present invention serves both as an emission layer that emits red light and as a second hole transport layer that transfers holes to the overlying yellow-green emission layer 132c. To this end, the red emission layer 134 according to the exemplary embodiment of the present invention may include at least one host (hereinafter, first red host) with the same or similar energy level to that of the second hole transport layer, and at least one dopant.

For reference, light-emitting materials may be classified roughly into host materials and guest materials from a functional point of view. In general, the use of only one host or guest material may produce light emission but with low color purity and low luminous efficiency. In this regard, high color purity and high luminous efficiency may be obtained by the use of a host/guest system in which the electroluminescence spectrum of a host overlaps the absorption spectrum of a guest.

The first red host refers to a hole transport-type (or hole transfer-type) host with a relatively strong hole property. For example, the LUMO (lowest unoccupied molecular orbital) energy level of the first red host may be 1.0 to 3.0 eV, and the HOMO (highest occupied molecular orbital) energy level of the first red host may be 4.9 to 6.0 eV.

In this case, the red emission layer 134 according to the exemplary embodiment of the present invention may further include a second red host.

The second red host refers to an electron transport-type (or electron transfer-type) host with a relatively strong hole property. For example, the LUMO (lowest unoccupied molecular orbital) energy level of the second red host may be 2.0 to 3.0 eV, and the HOMO (highest occupied molecular orbital) energy level of the second red host may be 5.0 to 6.5 eV.

In an example, the ratio of the first red host to the second red host in the red emission layer 134 according to the exemplary embodiment of the present invention may be 1:9 to 9:1.

If the red emission layer 134 includes a dopant, holes may be transferred to the yellow-green emission layer 132c, which is either adjoined to or separate from the red emission layer 134, by the movement of the first red host.

Due to the presence of the red emission layer 134 between the first charge generation layers 135a' and 135b' and the yellow-green emission layer 132c, electrons leaking from the yellow-green emission layer 132c are trapped, and this contributes to red light emission, thereby increasing red efficiency and contributing to improvement in panel brightness.

The first red host with the same or similar energy level to that of the second hole transport layer may be formed of, but is not limited to, a material for the hole transport layer represented by the following formula:

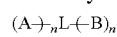

where A and B may be composed of

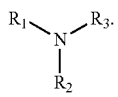

In the above formula, Rn (n=1~12) of A or B may be one among a substituted or unsubstituted aryl group with 6 to 24 carbon atoms, a substituted or unsubstituted condensed aryl group with 10 to 30 carbon atoms, a substituted or unsubstituted heteroaryl group with 2 to 24 carbon atoms, a substituted or unsubstituted alkyl group with 1 to 24 carbon atoms, a substituted or unsubstituted heteroalkyl group with 1 to 24 carbon atoms, a substituted or unsubstituted cycloalkyl group with 3 to 24 carbon atoms, a substituted or unsubstituted alkoxy group with 1 to 24 carbon atoms, a substituted or unsubstituted aryloxy group with 6 to 24 carbon atoms, a substituted or unsubstituted alkyl silyl group with 1 to 24 carbon atoms, a substituted or unsubstituted aryl silyl group with 6 to 24 carbon atoms, a cyano group, a halogen group, deuterium, and hydrogen, and R1 to R12 may form a condensed ring together with a neighboring substituent.

L is an aryl group which may be one among phenyl, naphthalene, fluorene, carbazole, phenazine, phenanthroline, phenanthridine, acridine, cinnoline, quinazoline, quinoxaline, naphthydrine, phtalazine, quinolizine, indole, indazole, pyridazine, pyrazine, pyrimidine, pyridine, pyrazole, imidazole, and pyrrole.

The first red host may include materials having the following chemical formulas:

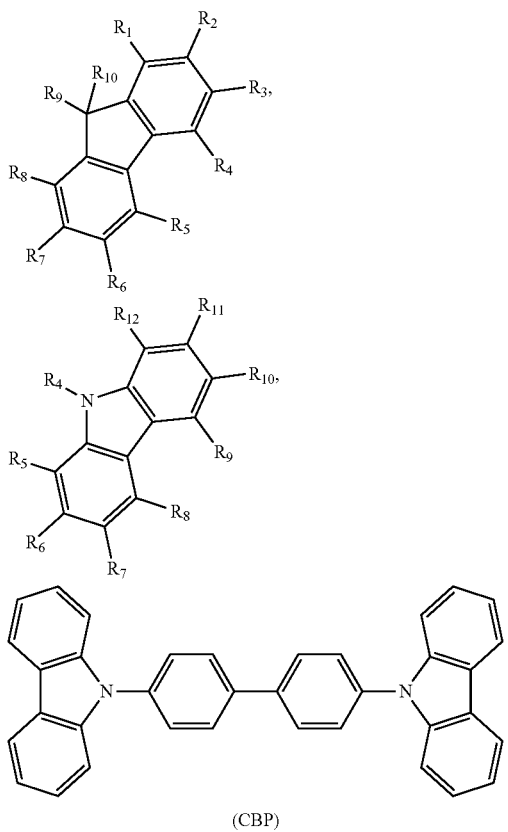

(CBP)

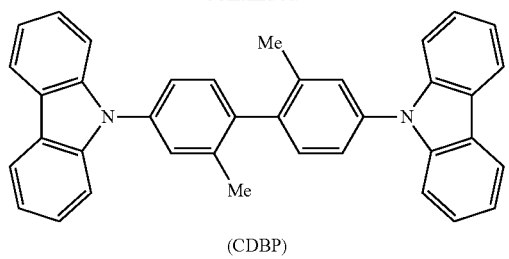

(CDBP)

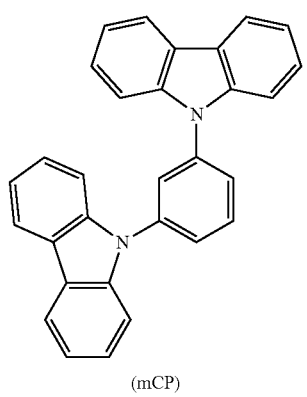

(mCP)

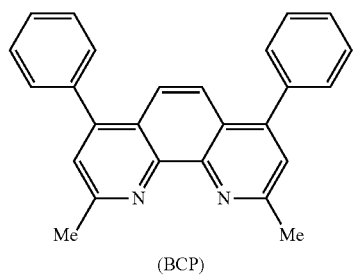

(BCP)

This red emission layer 134 may include one or more hosts, i.e., a first red host, and one or more dopants.

Another host, i.e., a second red host, of the red emission layer 134 may include, but is not limited to, a phosphorescent host.

The second red host may include materials having the following chemical formulas:

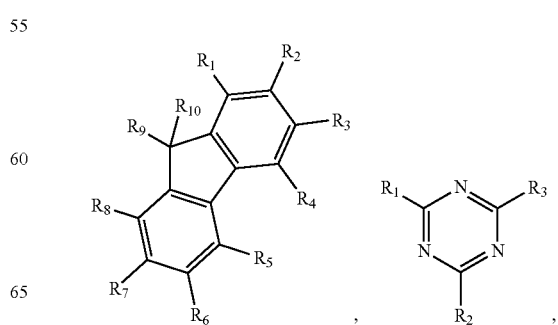

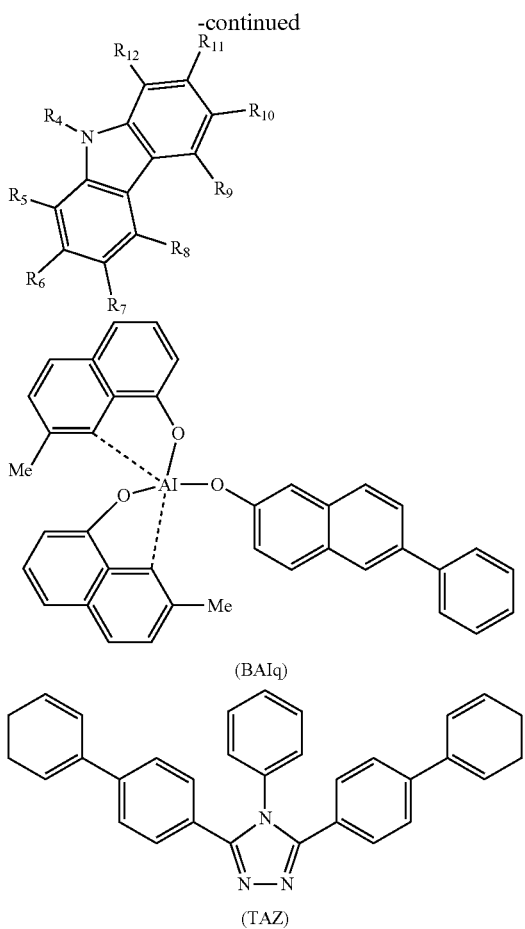

(BAlq)

(TAZ)

The phosphorescent host may include substituents such as above structures. The substituents Rn (n=1~12) may be one among a substituted or unsubstituted aryl group with 6 to 24 carbon atoms, a substituted or unsubstituted condensed aryl group with 10 to 30 carbon atoms, a substituted or unsubstituted heteroaryl group with 2 to 24 carbon atoms, a substituted or unsubstituted alkyl group with 1 to 24 carbon atoms, a substituted or unsubstituted heteroalkyl group with 1 to 24 carbon atoms, a substituted or unsubstituted cycloalkyl group with 3 to 24 carbon atoms, a substituted or unsubstituted alkoxy group with 1 to 24 carbon atoms, a substituted or unsubstituted aryloxy group with 6 to 24 carbon atoms, a substituted or unsubstituted alkyl silyl group with 1 to 24 carbon atoms, a substituted or unsubstituted aryl silyl group with 6 to 24 carbon atoms, a cyano group, a halogen group, deuterium, and hydrogen, and R1 to R12 may form a condensed ring together with a neighboring substituent.

The substituents may be a substituted or unsubstituted, fused or unfused aryl group, and may be formed by one to five multiple substitutions or non-multiple substitutions on a core structure having phenyl, naphthalene, fluorene, carbazole, phenazine, phenanthroline, phenanthridine, acridine, cinnoline, quinazoline, quinoxaline, naphthydrine, phtalazine, quinolizine, indole, indazole, pyridazine, pyrazine, pyrimidine, pyridine, pyrazole, imidazole, or pyrrole.

A phosphorescent dopant may be formed of a metal compound in which three of N—N, N—O, or O—O bonds coordinate to the iridium (Ir) metal center.

The red emission layer 134 may be 5 to 300 Å thick, preferably, 50 to 150 Å thick. The red emission layer 134 may emit fluorescent or phosphorescent light.

A phosphorescent dopant in the red emission layer 134 may be formed of, but is not limited to, Ir(piq)3(Tris(1-phenylisoquinoline]iridium(III)), Ir(piq)2(acac)(Bis(1-phenylisoquinoline)(acetylacetonate)iridum(III)), Ir(btp)2(acac)(Bis)2-benzo[b]thiophen-2-yl-pyridine) (acetylacetonate)iridium(III)), Ir(BT)2(acac)(Bis(2-phenylbenzothazolato)(acetylacetonate)iridium(III)), and so on.

A fluorescent dopant in the red emission layer 134 may be formed of, but is not limited to, Rubrene(5,6,11,12-tetraphenylnaphthacene), DCJTB (4-(dicyanlmethylene)-2-tert-butyl-6-(1,1,7,7-tetramethyljuloidin-4-yl-vinyl)-4H-pyran), and so on.

A doping concentration of a red dopant of the red emission layer 134 may range from 0.1 to 10%, preferably, 0.5 to 3%. Hereinafter, a doping concentration of a dopant refers to a dopant concentration in a host.

Figure 9:
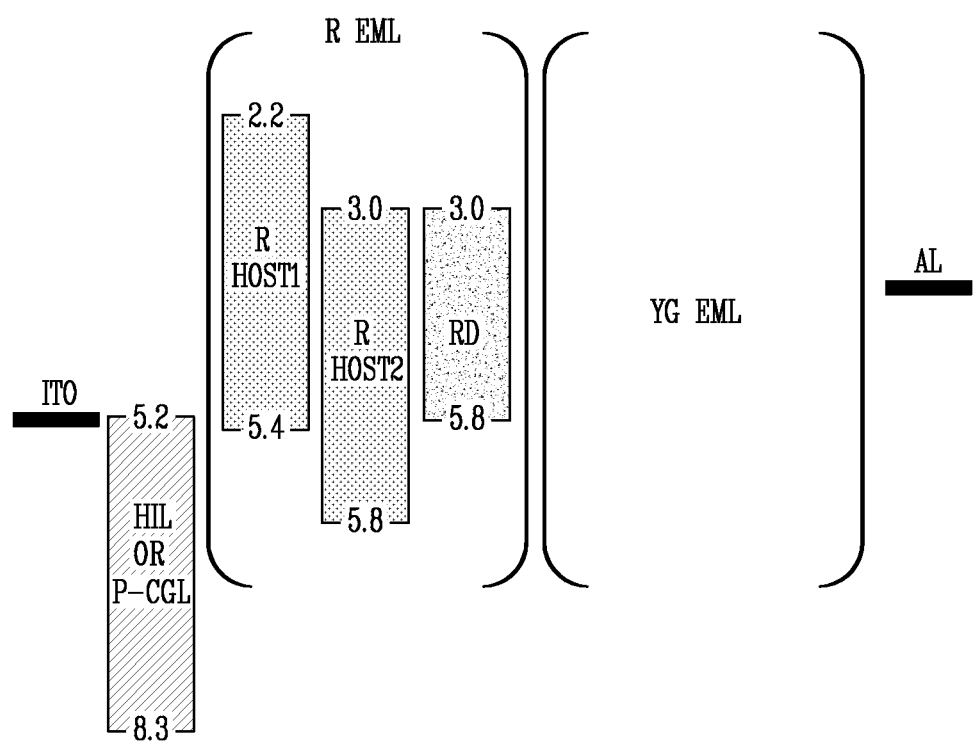
FIG. 9 is a view schematically showing a band diagram of the organic light-emitting display device according to the exemplary embodiment of the present invention.

FIG. 9 is a view schematically showing a band diagram of the organic light-emitting display device according to the exemplary embodiment of the present invention.

By way of example, FIG. 9 shows a red emission layer R EML having a first red host R HOST1, a second red host R HOST2, and a red dopant RD. However, the present invention is not limited to this example, and the red emission layer R EML may include at least one host and at least one dopant.

Referring to FIG. 9, it can be seen that, in the red emission layer R EML according to the exemplary embodiment of the present invention, the LUMO and HOMO energy levels of the first red host R HOST1 are 2.2 eV and 5.4 eV, respectively, which are in the same range as the second hole transport layer. The first red host R HOST1 is a hole transport-type host that transports holes better than electrons. Accordingly, the LUMO energy level of the first red host R HOST1 may be 1.0 to 3.0 eV, and the HOMO energy level thereof may be 4.9 to 6.0 eV. And, the LUMO energy level of the second red host R HOST2 may be 2.0 to 3.0 eV, and the HOMO energy level thereof may be 5.0 to 6.5 eV. As shown in FIG. 9, it can be seen that the LUMO energy level of a first P-type charge generation layer P-CGL adjoining the first red host R HOST1 is 5.2 eV and the HOMO energy level thereof is 8.3 eV. And, it can be seen that the LUMO energy level of the red dopant RD is 3.0 eV and the HOMO energy level thereof is 5.0 eV. In FIG. 9, ITO represents the first electrode, and AL represents the second electrode.

The red emission layer R EML according to the exemplary embodiment of the present invention may function as a substitute for the second hole transport layer. That is, holes may be transferred to a yellow-green emission layer YG EML by inserting the red emission layer R EML between the first P-type charge generation layer P-CGL and the yellow-green emission layer YG EML, thereby enhancing the efficiency of the yellow-green emission layer YG EML and improving red efficiency.

In the present invention, the yellow-green emission layer YG EML of the second light-emitting part is a main emission layer, and the red emission layer R EML is an auxiliary emission layer that emits red light and also serves as the second hole transport layer. With this configuration, brightness, color gamut, and color shift rate may be improved.

That is, the red emission layer R EML functions to compensate for the lack of red efficiency that is not overcome by the blue emission layer and the yellow-green emission layer YG EML alone. Also, the first red host R HOST1 of the red emission layer R EML has the same energy level as the second hole transport layer, and may serves as a second hole transport layer that transfers holes to the overlying yellow-green emission layer YG EML by the movement of the first red host R HOST1, i.e, a hole transport-type host. Accordingly, brightness, color gamut, and color shift rate may be improved compared to the related art, without an additional process.

Moreover, the red dopant RD of the red emission layer R EML may protect the first P-type charge generation layer P-CGL by trapping electrons leaking from the yellow-green emission layer YG EML. Also, due to the presence of the red emission layer R EML between the first P-type charge generation layers P-CGL and the yellow-green emission layer YG EML, electrons leaking from the yellow-green emission layer YG EML are trapped, and this contributes to red light emission, thereby increasing red efficiency and contributing to improvement in panel brightness.

Figure 10A:
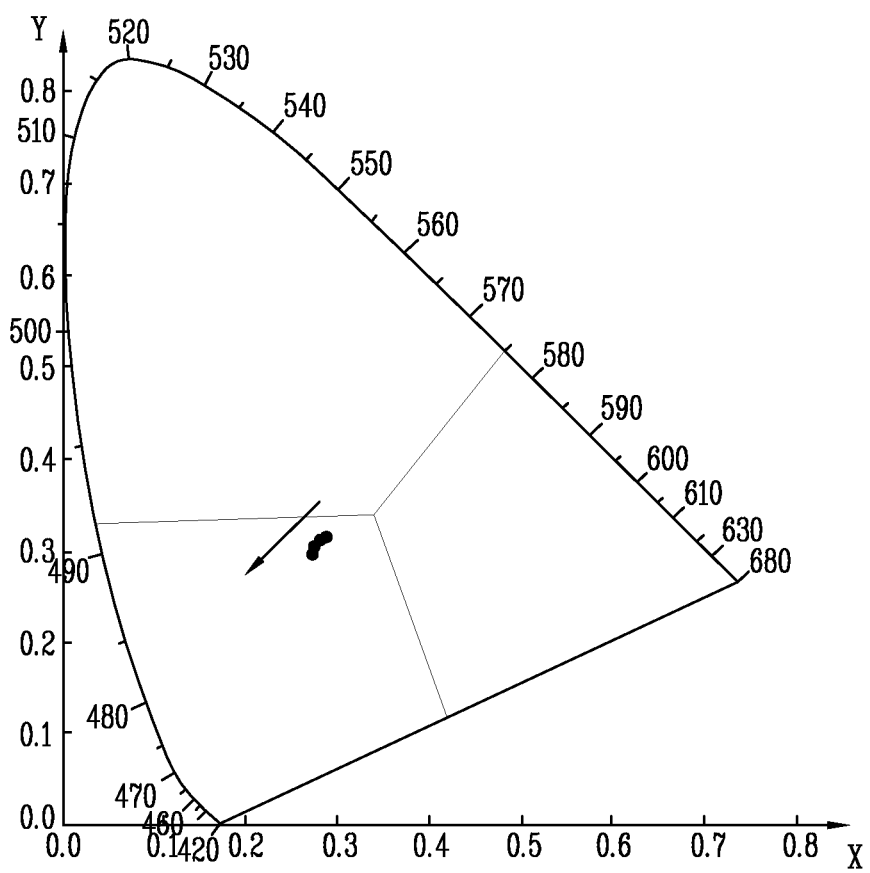
FIGS. 10A, 10B, and 10C are views schematically showing variations in chromaticity coordinates at viewing angles of 0° to 60°.
Figure 10B:
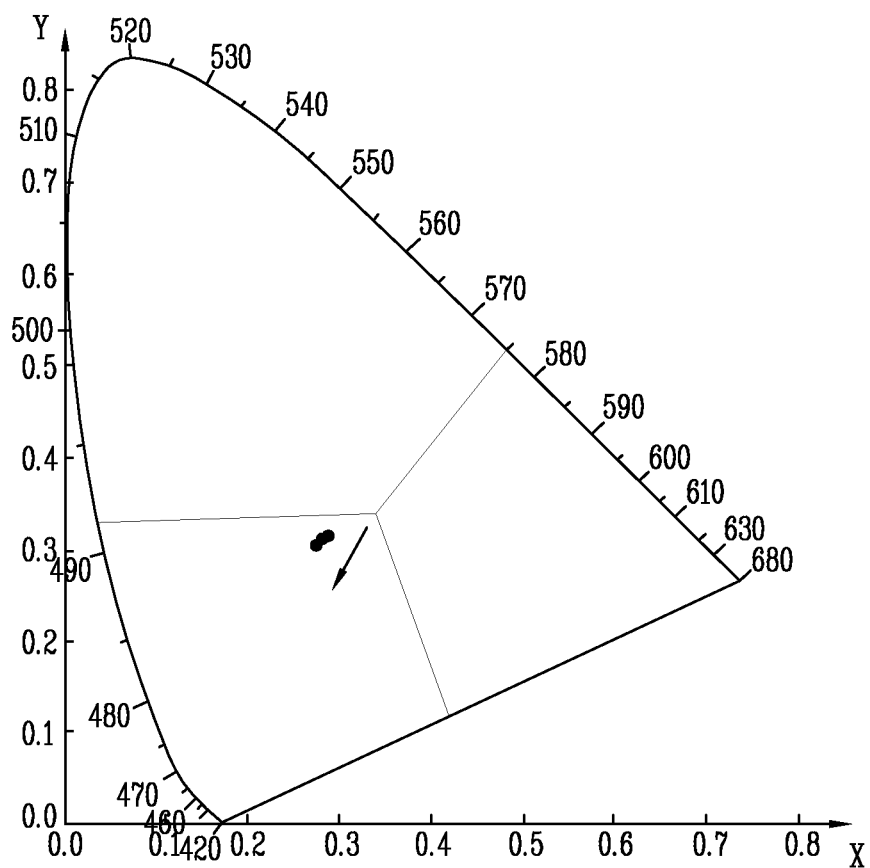
Figure 10C:
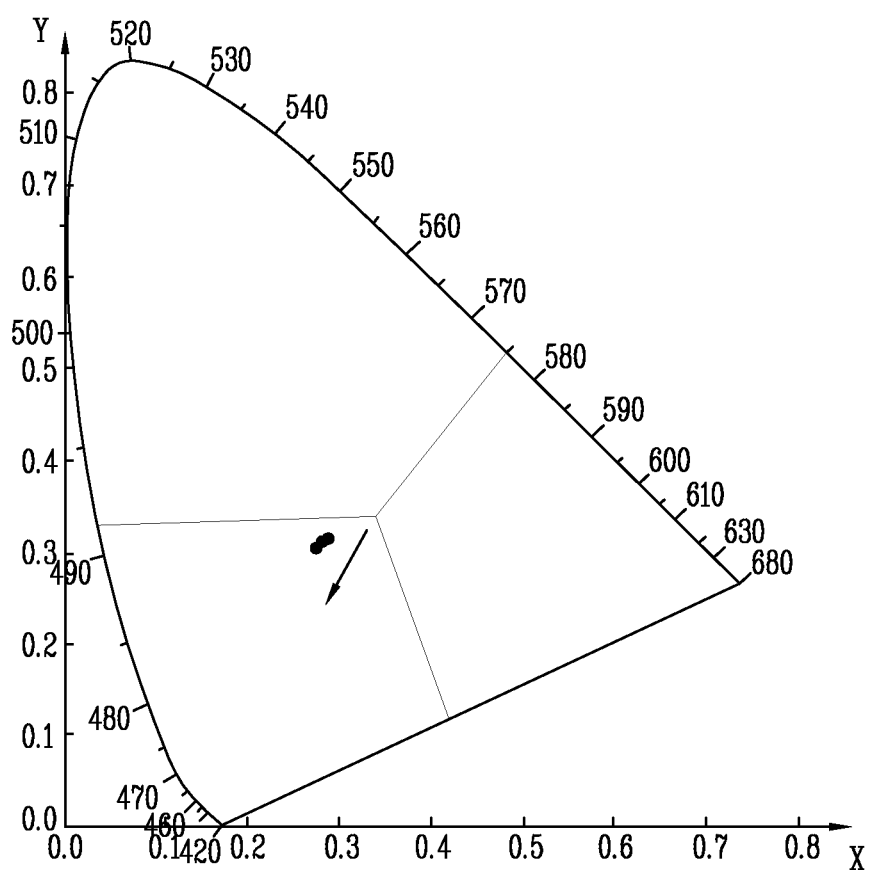

FIGS. 10A, 10B, and 10C are views schematically showing variations in chromaticity coordinates at viewing angles of 0° to 60°.

FIG. 10A shows, by way of example, variations in chromaticity coordinates at different viewing angles, in an organic light-emitting diode having a 3-stack structure which includes no red emission layer according to Comparative Example. In Comparative Example, measurements were made using a hole transport layer with a thickness of 60 Å, for example. In Test Examples 1 and 2, a red emission layer contains one host and one dopant.

FIG. 10B and FIG. 10C show, by way of example, variations in chromaticity coordinates at different viewing angles, in an organic light-emitting diode having a 3-stack structure (three light-emitting parts structure) which includes a red emission layer according to the exemplary embodiment of the present invention. FIG. 10B shows an example in which the red dopant of the red emission layer has a doping concentration of 1% (Test Example 1), and FIG. 10C shows an example in which the red dopant of the red emission layer has a doping concentration of 3% (Test Example 2). In both cases, a single host with a thickness of about 100 Å, i.e., a first red host, was used.

Figure 11:
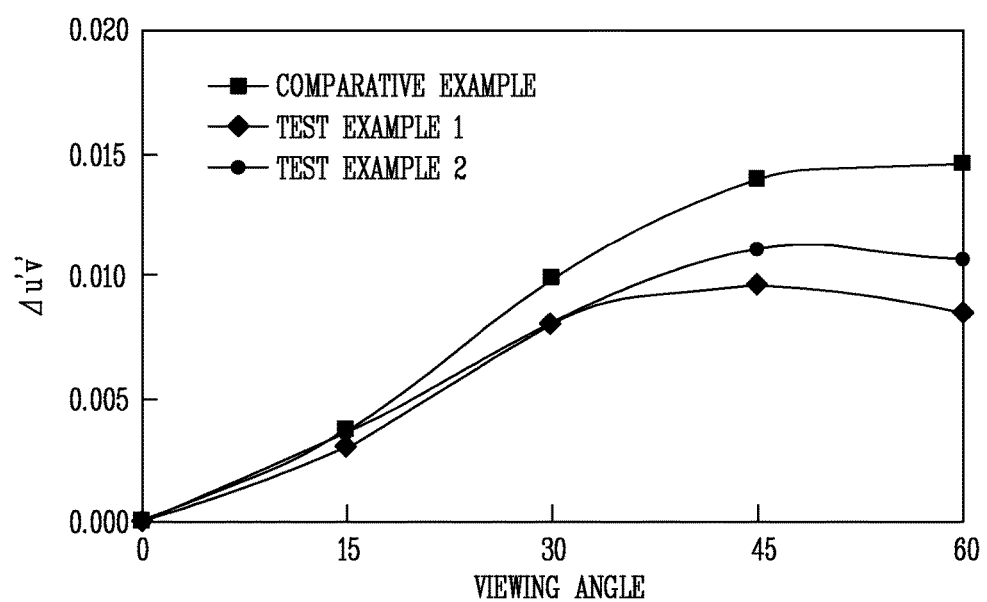
FIG. 11 is a graph showing variations in chromaticity coordinates with viewing angle.

FIG. 11 is a graph showing variations in chromaticity coordinates with viewing angle.

The color shift rate ($\Delta u'v'$) in the CIE 1931 chromaticity coordinates of light emitted from the organic light-emitting display device is set to be 0.020 or less at viewing angles of 0° to 60°. The shift rate ($\Delta u'v'$) in chromaticity coordinates is defined as a difference between initial chromaticity coordinates (u'0, v'0) and chromaticity coordinates (u't, v't) measured after a predetermined time t, according to the CIE 1931 colorimetric system.

If the color shift rate ($\Delta u'v'$) is 0.020 or less, the user will hardly perceive viewing angle-dependent color changes.

For reference, the color gamut (or range of color reproduction) refers to a range of colors that can be reproduced by a certain input/output device, which depends on how a color space is defined.

There is quite a big difference between representing the main properties of a color in a two-dimensional plane and representing them in a three-dimensional plane. And, even the most basic RGB color space for three-dimensional representation may take different forms depending on how the concept is defined.

Also, a two-dimensional space takes different forms depending on how the properties of a color are defined.

Studies were conducted to compensate for the huge deviation between visual color differences and numerical color differences observed in the CIE xy color space that has been used up to the present since 1931, and the CIE uv color space was selected as a new standard in 1960. Then, after additional studies, the CIE u'v' color space was selected as a standard in 1976. The differences include an only a slight modification of scale in which u'=u and v'=3/2v, as compared to the CIE uv.

Referring to FIG. 10A, and FIG. 11, Comparative Example shows that the color shift rate ($\Delta u'v'$) in chromaticity coordinates is about 0.015 when the viewing angle changes from 0° to 60°.

In contrast, referring to FIG. 10B, and FIG. 11, Test Example 1 shows that the color shift rate ($\Delta u'v'$) in chromaticity coordinates is about 0.010 when the viewing angle changes from 0° to 60°.

Referring to FIG. 10C, and FIG. 11, Test Example 2 shows that the color shift rate ($\Delta u'v'$) in chromaticity coordinates is about 0.011 when the viewing angle changes from 0° to 60°.

This indicates that Test Examples 1 and 2 had an improvement in color shift rate and color gamut by the addition of a red emission layer, as compared to Comparative Example. Also, the DCI (Digital Cinema Initiatives) coverage measured by Comparative Example was 91.3%, and the DCI coverage measured by Test Examples 1 and 2 was 94.7%. DCI coverage may be said to be a DCI color gamut satisfaction level. This indicates that Test Examples 1 and 2 had an improvement in color gamut, compared to Comparative Example. Also, this wide DCI coverage provides a higher picture quality in large-size televisions or the like.

Regarding red efficiency, the red efficiency measured by Comparative Example was (0.666, 0.330), and the red efficiency measured by Test Examples 1 and 2 was (0.671, 0.325). This indicates that Test Examples 1 and 2 had an improvement in red efficiency as compared to Comparative Example. From this result, it is concluded that the amount of variation in chromaticity coordinates is small when the red dopant has a low doping concentration.

Figure 12A:
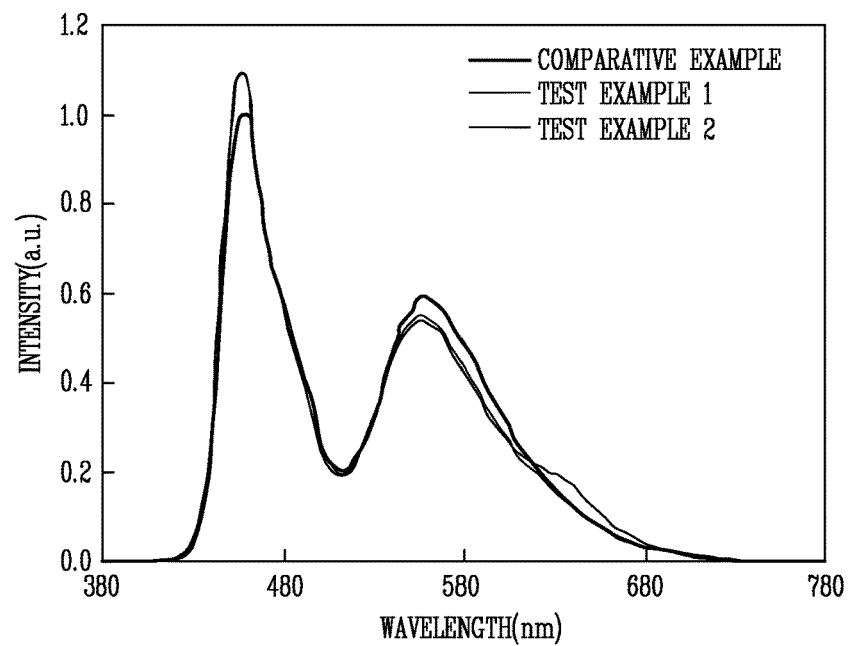
FIGS. 12A and 12B are graphs of light intensity vs. wavelength.
Figure 12B:
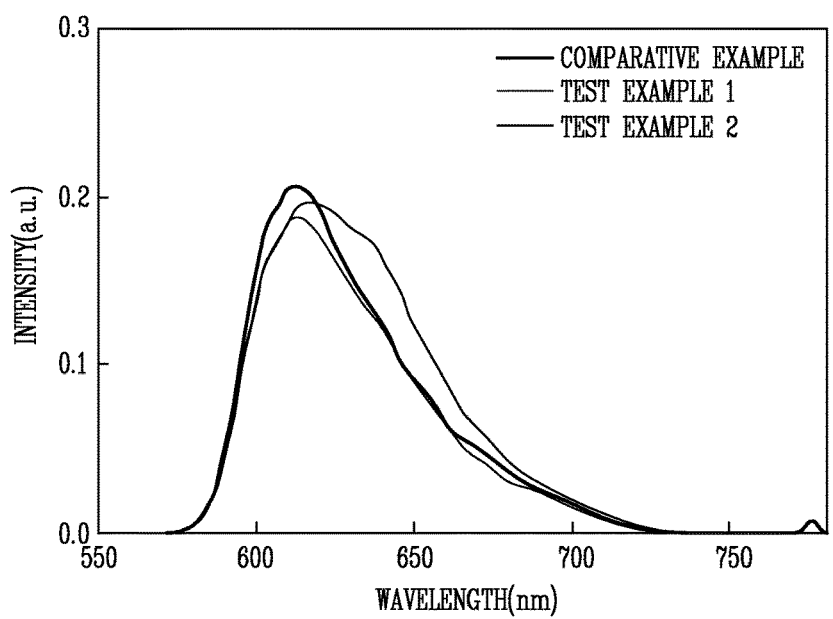

FIGS. 12A and 12B are graphs of light intensity vs wavelength.

FIG. 12A shows the light intensity over the entire wavelength range of 380 nm to 780 nm. FIG. 12B shows the light intensity (i.e., electroluminescence spectrum) vs. wavelength, in a red wavelength region of 600 nm to 650 nm.

An electroluminescence spectrum is determined by the product of a Photoluminescence (PL) peak at which an emission layer's unique color is represented and an Emittance (EM) peak of organic layers constituting an organic light-emitting diode.

Particularly, FIG. 12B shows the light intensity (electroluminescence spectrum) vs wavelength after light passes through the color filters.

As stated above, Comparative Example concerns an organic light-emitting diode having a 2-stack (or 3-stack) structure which includes no red emission layer.

Test Example 1 concerns an organic light-emitting diode having a 3-stack structure which includes a red emission layer according to the exemplary embodiment of the present invention, in which case the red dopant of the red emission layer has a doping concentration of 1%. Test Example 2 concerns an organic light-emitting diode having a 3-stack structure which includes a red emission layer according to the exemplary embodiment of the present invention, in which case the red dopant of the red emission layer has a doping concentration of 3%.

For convenience, Comparative Example is depicted with a solid line, and Test Examples 1 and 2 are depicted with a dotted line and a one-dot chain line.

Referring to FIG. 12A, Test Example 2 had an emission peak at red wavelengths (600~650 nm) and exhibited a slight increase in light intensity, as compared to Comparative Example.

Test Example 2 exhibited an increase in light intensity at blue wavelengths (440~480 nm), as compared to Comparative Example. Comparative Example and Test Examples 1 and 2 had similar light intensity at yellow-green wavelengths (510~590 nm).

Referring to FIG. 12B, Test Example 2 exhibited an increase in red efficiency at the red wavelengths (600~650 nm), as compared to Comparative Example. Test Example 2 had a peak at the red wavelengths as compared to Comparative Example, thereby achieving an improvement in color gamut. For reference, efficiency can be calculated from the peak area on the graph.

The addition of a red emission layer according to the present invention may improve color gamut, since red light locates at an region of a longer wavelength as compared to Comparative Example.

Comparative Example, Test Example 1, and Test Example 2 are estimated to have an overall brightness of 207, 262, and 240, respectively, at 8.5 A. These estimates indicate that Test Examples 1 and 2 had an increase of about 27% and 16%, respectively, in brightness as compared to Comparative Example.

Figure 13A:
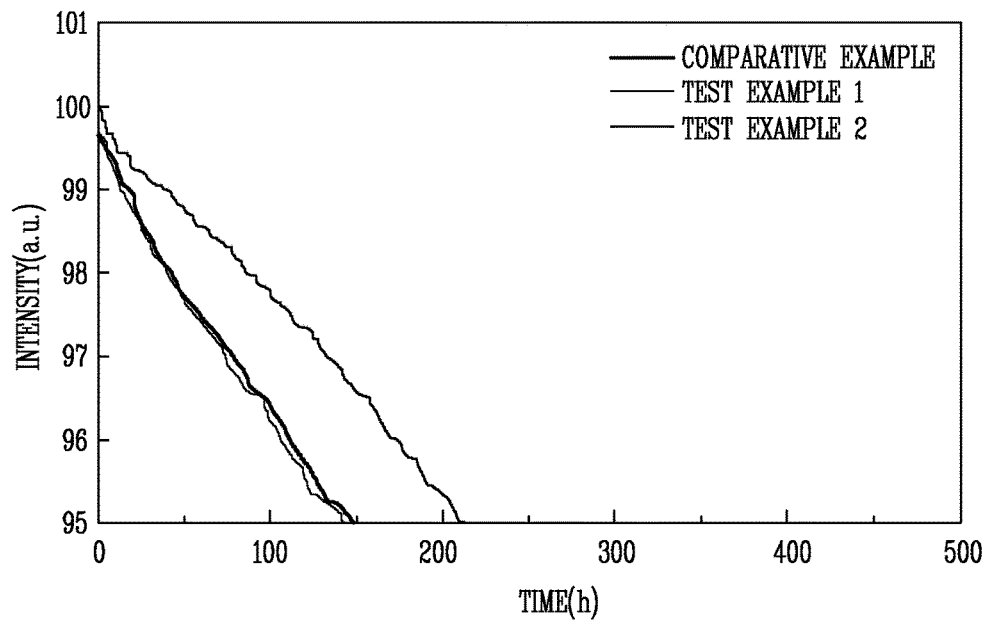
FIGS. 13A and 13B are graphs showing variations in light intensity over time.
Figure 13B:
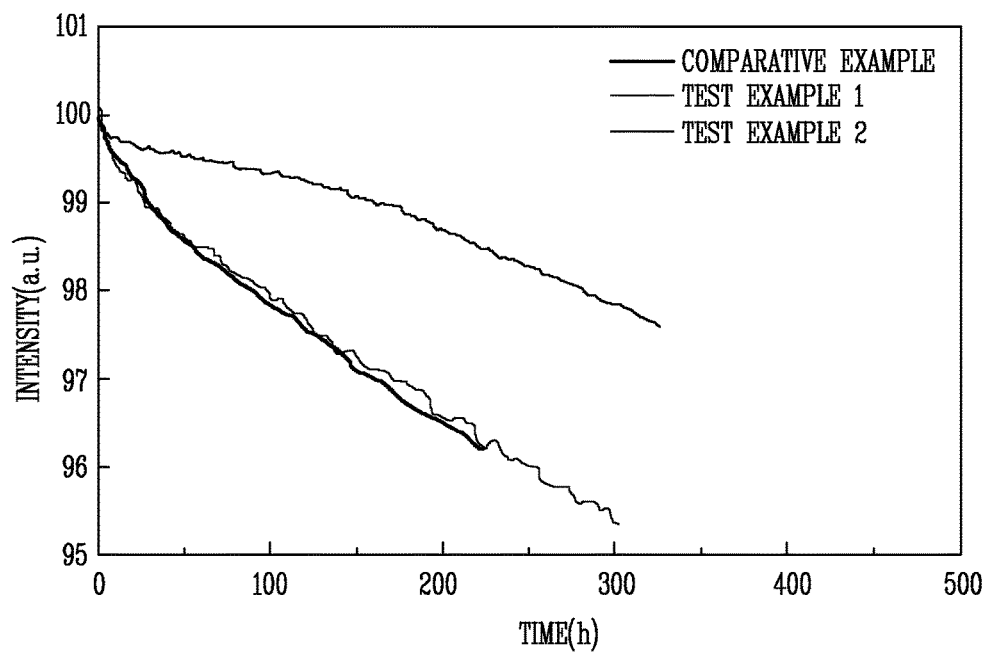

FIGS. 13A and 13B are graphs showing variations in light intensity over time.

FIG. 13A shows variations in light intensity over time of a blue emission layer. FIG. 13B shows variations in light intensity over time of a yellow-green emission layer.

Referring to FIG. 13A, Test Examples 1 and 2 took the same or less time to reach 95% of the light intensity for the blue emission layer, as compared to Comparative Example. This indicates that Test Examples 1 and 2 had an improvement in the lifetime of the blue emission layer, as compared to Comparative Example.

Referring to FIG. 13B, Test Examples 1 and 2 had an improvement in the lifetime of the yellow-green emission layer as well, as compared to Comparative Example.

As stated above, the red emission layer may contain one or more hosts. By way of example, the chromaticity coordinate variations and efficiency of a red emission layer containing a mixed host of two hosts, i.e., a first red host and a second red host, will be discussed. The one or more hosts include a hole transport-type host with the same or similar energy level to that of the above-explained second hole transport layer.

Figure 14:
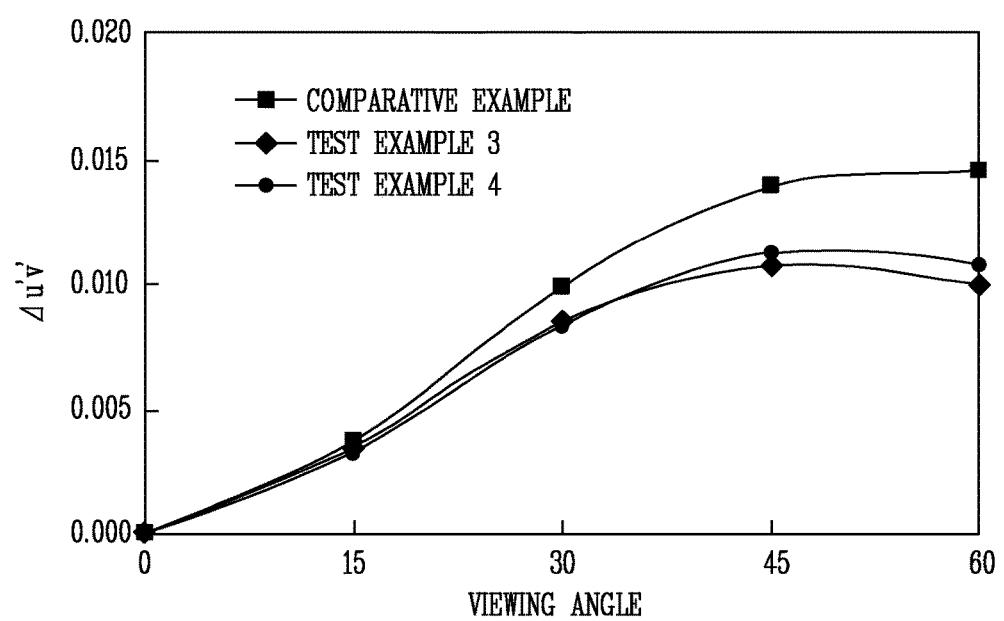
FIG. 14 is another graph showing variations in chromaticity coordinates with viewing angle.

FIG. 14 is another graph showing variations in chromaticity coordinates with viewing angle.

As stated above, Comparative Example concerns an organic light-emitting diode having a 3-stack structure which includes no red emission layer. In Comparative Example, measurements were made using a hole transport layer with a thickness of 60 Å, for example.

Test Example 3 concerns an organic light-emitting diode having a 3-stack structure which includes a red emission layer according to the exemplary embodiment of the present invention, in which case both the first red host and the second red host are 50 Å thick. Test Example 4 concerns an organic light-emitting diode having a 3-stack structure which includes a red emission layer according to the exemplary embodiment of the present invention, in which case the first red host and the second red host are 70 Å and 30 Å thick, respectively. In this case, the first red host is a hole transport-type host with the same or similar energy level to that of the above-explained hole transport layer.

In both Test Examples 3 and 4, the red dopant of the red emission layer has a 1% doping concentration.

Referring to FIG. 14, Test Examples 3 and 4 show that the color shift rate (Δu'v') in chromaticity coordinates is about 0.011 when the viewing angle changes from 0° to 60°.

This indicates that Test Examples 3 and 4 had an improvement in color shift rate and color gamut by the addition of the red emission layer, as compared to Comparative Example. Also, the DCI (Digital Cinema Initiatives) coverage measured by Comparative Example was 91.3%, and the DCI coverage measured by Test Examples 3 and 4 was 94.2% and 94.6%, respectively. DCI coverage may be said to be a DCI color gamut satisfaction level. This indicates that Test Examples 3 and 4 had an improvement in color gamut, compared to Comparative Example. Also, this wide DCI coverage provides a higher picture quality in large-size televisions or the like.

Figure 15A:
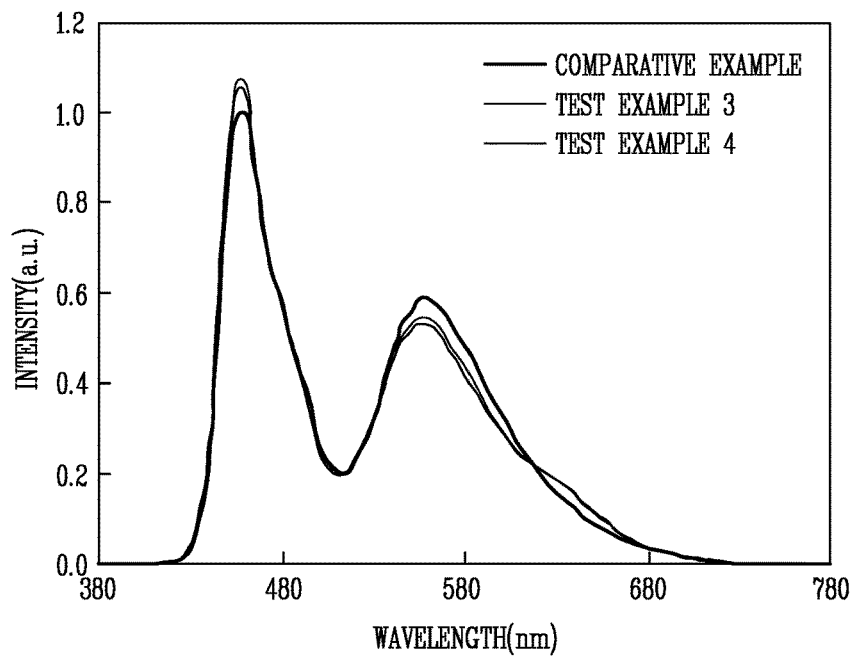
FIGS. 15A and 15B are other graphs of light intensity vs. wavelength.
Figure 15B:
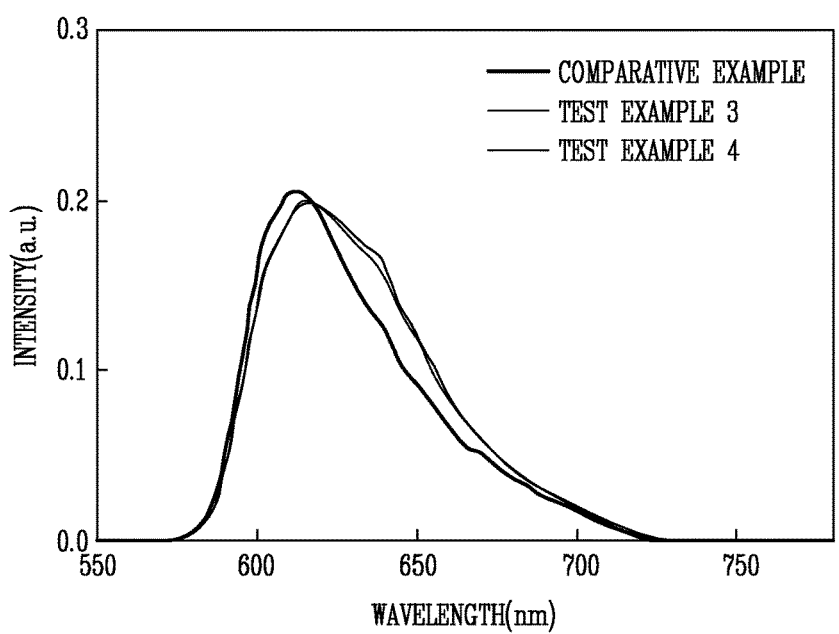

FIGS. 15A and 15B are other graphs of light intensity vs wavelength.

FIG. 15A shows the light intensity over the entire wavelength range of 380 nm to 780 nm. FIG. 15B shows the light intensity (i.e., electroluminescence spectrum) vs. wavelength, in a red wavelength region of 600 nm to 650 nm.

Particularly, FIG. 15B shows the light intensity (electroluminescence spectrum) vs wavelength after light passes through the color filters.

For convenience, Comparative Example is depicted with a solid line, and Test Examples 3 and 4 are depicted with a dotted line and a one-dot chain line.

Referring to FIG. 15A, Test Examples 3 and 4 exhibited a slight increase in light intensity, as compared to Comparative Example. Test Examples 3 and 4 exhibited an increase in light intensity at blue wavelengths (440~480 nm), as compared to Comparative Example. Test Examples 3 and 4 had similar light intensity at yellow-green wavelengths (510~590 nm), as compared to Comparative Example.

Referring to FIG. 15B, Test Examples 3 and 4 exhibited an increase in red efficiency, as compared to Comparative Example.

The addition of a red emission layer according to the present invention may improve color gamut, as compared to Comparative Example, since red light has a longer wavelength.

Comparative Example, Test Example 3, and Test Example 4 are estimated to have an overall brightness of 207, 245, and 248, respectively, at 8.5 A. These estimates indicate that Test Examples 3 and 4 had an increase of about 18% and 20%, respectively, in brightness as compared to Comparative Example. In view of this, it is concluded that, if the thickness ratio of the first red host and the second red host is between 5:5 and 7:3, brightness and red efficiency may be increased compared to Comparative Example.

Meanwhile, the present invention does not preclude the addition of an auxiliary layer composed of a hole transport-type host between a charge generation layer and a red emission layer. This will be described in detail through another exemplary embodiment that follows.

Figure 16:
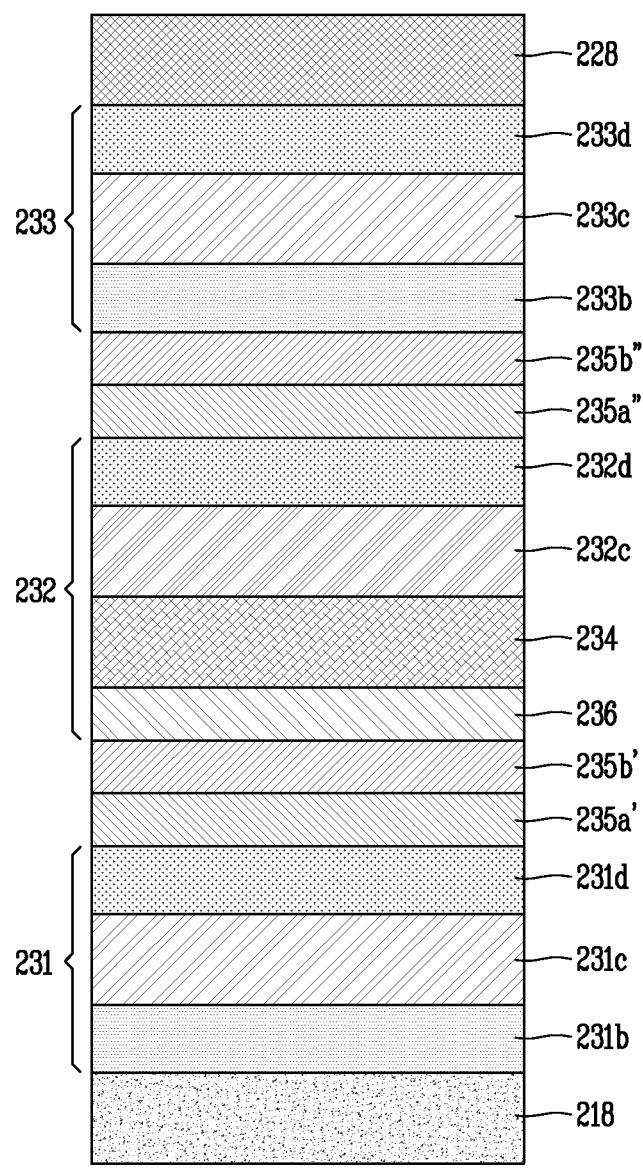
FIG. 16 is an illustration schematically showing a structure of an organic light-emitting diode in a white organic light-emitting display device according to another exemplary embodiment of the present invention.

FIG. 16 is an illustration schematically showing a structure of an organic light-emitting diode in a white organic light-emitting display device according to another exemplary embodiment of the present invention.

The organic light-emitting diode according to another exemplary embodiment of the present invention illustrated in FIG. 16 has substantially the same structure as the above-described organic light-emitting diode of FIG. 9 according to the exemplary embodiment of the present invention, except that an auxiliary layer composed of a hole transport-type host is inserted between a charge generation layer and a red emission layer.

Referring to FIG. 16, an organic light-emitting diode having a 3-stack, 3-peak structure according to another exemplary embodiment of the present invention includes a first electrode 218, a second electrode 228, and a light-emitting part between the first electrode 218 and the second electrode 228.

The light-emitting part may include a first light-emitting part 231, a second light-emitting part 232, and a third light-emitting part 233.

In this case, a first N-type charge generation layer 235a' and a first P-type charge generation layer 235b' may be between the first light-emitting part 231 and the second light-emitting part 232. A second N-type charge generation layer 235a" and a second P-type charge generation layer 235b" may be between the second light-emitting part 232 and the third light-emitting part 233.

In this case, the first N-type charge generation layer 235a' serves to inject electrons into the first light-emitting part 231, and the first P-type charge generation layer 235b' serves to inject holes into the second light-emitting part 232. Likewise, the second N-type charge generation layer 235a" serves to inject electrons into the second light-emitting part 232, and the second P-type charge generation layer 235b" serves to inject holes into the third light-emitting part 233.

As stated before, various types of organic materials with strong electron donor and acceptor properties may be used as the charge generation layers 235a', 235a", 235b', and 235b".

In an example, the P-type charge generation layers 235b' and 235b" may have a HAT-CN (Dipyrazino[2,3-f:2',3'-h]quinoxaline-2,3,6,7,10,11-hexacarbonitrile) or P-doped structure.

Also, the charge generation layers 235a', 235a", 235b', and 235b" may be composed of a single layer such as HAT-CN.

In the case of a light-emitting part including three stacks, the first charge generation layers 235a' and 235b' adjust the balance of charges between the first light-emitting part 231 and the second light-emitting part 232, and the second charge generation layers 235a" and 235b" adjust the balance of charges between the second light-emitting part 232 and the third light-emitting part 233. However, as stated above, the present invention is not limited to the 3-stack structure.

The first light-emitting part 231 may include a first hole transport layer 231b, a blue emission layer 231c, and a first electron transport layer 231d. Each layer included in the first light-emitting part 231 is located over the first electrode 218.

The blue emission layer 231c is an emission layer that contains a blue dopant and a host and emits blue light. The blue emission layer 231c may contain at least one host, i.e., a mixed host, and at least one dopant. Specifically, the blue emission layer 231c may be composed of, but not necessarily limited to, at least one fluorescent host material one among an anthracene derivative, a pyrene derivative, and a perylene derivative, to which a fluorescent blue dopant is added.

Depending on the configuration of the device, a first hole injection layer may further include between the first electrode 218 and the first hole transport layer 231b. Also, a first electron injection layer may further include between the first electron transport layer 231d and the first charge generation layers 235a' and 235b'.

The first hole transport layer 231b may be composed of a single layer or two layers. The second light-emitting part 232 may include a red emission layer 234, a yellow-green emission layer 232c, and a second electron transport layer 232d. Each layer included in the second light-emitting part 232 is located over the first charge generation layers 235a' and 235b'. In this case, the second light-emitting part 232 according to another exemplary embodiment of the present invention may further include one or more auxiliary layers 236 interposed between the first charge generation layers 235a' and 235b' and the red emission layer 234.

The yellow-green emission layer 232c may contain at least one host and at least one dopant. Specifically, the yellow-green emission layer 232c may be composed of a phosphorescent host material of carbazole compound or metal deposit, to which a phosphorescent yellow-green dopant is added. The carbazole compound may include CBP(4,4'-bis(carbazol-9-yl)-biphenyl), a CBP derivative, mCP (N,N'-dicarbazolyl-3,5-benzene), or an MCP derivative. The metal deposit may include a ZnPBO (phenyloxazole) metal deposit or a ZnPBT (phenylthiazole) metal deposit. The yellow-green emission layer 232c may have a wavelength range of 510 nm to 590 nm. The yellow-green emission layer 232c is an emission layer that contains a yellow-green dopant and a host and emits yellow-green light.

Depending on the configuration of the device, a second electron injection layer may further include between the second electron transport layer 232d and the second charge generation layers 235a" and 235b".

The third light-emitting part 233 may include a third hole transport layer 233b, a blue emission layer 233c, and a third electron transport layer 233d. Each layer included in the third light-emitting part 233 is over the second charge generation layers 235a" and 235b".

Depending on the configuration of the device, a third hole injection layer may further include between the second charge generation layers 235a" and 235b" and the third hole transport layer 233b, and a third electron injection layer may further include between the third electron transport layer 233d and the second electrode 228.

The third hole transport layer 233b may be composed of a single layer or two layers.

A deep blue emission layer or a sky blue emission layer may substitute for the blue emission layer 233c. The blue emission layer 233c may have a wavelength range of 440 nm to 480 nm. The blue emission layer 233c may emit either fluorescent light or phosphorescent light.

The blue emission layer 233c may include at least one host and at least one dopant. Specifically, the blue emission layer 233c may be composed of, but not necessarily limited to, at least one fluorescent host material among an anthracene derivative, a pyrene derivative, and a perylene derivative, to which a fluorescent blue dopant is added.

Accordingly, white light may be produced from a combination of blue light from the blue emission layers 231c and 233c and orange light from the yellow-green emission layer 232c. Especially, the present invention may produce full white light because the red emission layer 234 provided in the light-emitting part 232, in addition to the blue emission layers 231c and 233c and the yellow-green emission layer 232c, makes up for the lack of red efficiency. That is, the red emission layer 234 of this invention has a wavelength spectrum of 600 to 650 nm, and therefore white light produced by the white organic light-emitting diode of this invention has a wide wavelength range of 440 to 650 nm.

Moreover, the present invention has a 3-peak structure with three emission peaks by the use of the red emission layer 234. The three emission peaks may have a wavelength of 440 to 480 nm corresponding to a blue region, a wavelength of 510 to 590 nm corresponding to a yellow-green region, and a wavelength of 600 to 650 nm corresponding to a red region, respectively. Accordingly, the organic light-emitting display device may improve red efficiency, color gamut, and color shift rate. Also, the organic light-emitting display device may improve red efficiency, color gamut, and color shift rate by including the red emission layer 234.

In addition, light emitted from the yellow-green emission layer 232 is highly visible, and this may improve the visual sensitivity to white light produced by the white organic light-emitting diode of this invention.

In this way, the white organic light-emitting display device according to another exemplary embodiment of the present invention has a 3-stack structure including three light-emitting parts 231, 232, and 233, in substantially the same manner as the white organic light-emitting display device according to the foregoing exemplary embodiment. Also, the charge generation layers 235a', 235a", 235b', and 235b" are formed between the three light-emitting parts 231, 232, and 233.

However, the present invention is not limited to this 3-stack structure, and as stated above, the present invention may be applicable to an n-stack structure with 2 stacks, 4-stack, or more.

Particularly, in the white organic light-emitting display device according to another exemplary embodiment of the present invention, an auxiliary layer 236 composed of a hole transport-type host and the red emission layer 234 having a hole transport-type host are between the first charge generation layers 235a' and 235b' and the yellow-green emission layer 232c of the second light-emitting part 232.

That is, the red emission layer 234 of this invention is provided not in an additional light-emitting part, but in the second light-emitting part 232 with the yellow-green emission layer 232c.

Moreover, the red emission layer 234 according to another exemplary embodiment of the present invention may substitute for the second hole transport layer. That is, the red emission layer 234 according to another exemplary embodiment of the present invention serves both as an emission layer that emits red light and as a second hole transport layer that transfers holes to the overlying yellow-green emission layer 232c. To this end, the red emission layer 234 according to another exemplary embodiment of the present invention may include at least one host, i.e., a first red host, with the same or similar energy level to that of the second hole transport layer, and at least one dopant.

As stated above, the first red host refers to a hole transport-type (or hole transfer-type) host with a relatively strong hole property. For example, the LUMO (lowest unoccupied molecular orbital) energy level of the first red host may be 1.0 to 3.0 eV, and the HOMO (highest occupied molecular orbital) energy level of the first red host may be 4.9 to 6.0 eV.

In this case, the red emission layer 234 according to another exemplary embodiment of the present invention may further include a second red host.

The second red host refers to an electron transport-type (or electron transfer-type) host with a relatively strong hole property. For example, the LUMO energy level of the second red host may be 2.0 to 3.0 eV, and the HOMO energy level of the second red host may be 5.0 to 6.5 eV.

In an example, the ratio of the first red host to the second red host in the red emission layer 234 according to another exemplary embodiment of the present invention may be 1:9 to 9:1.

In this case, if the red emission layer 234 includes a minimum amount of dopant, holes may be transferred to the yellow-green emission layer 232c, which is either adjoined to or separate from the red emission layer 234, by the movement of the first red host.

Due to the presence of the auxiliary layer 236 composed of a hole transport-type host between the charge generation layers 235a' and 235b' and the red emission layer 234, as well as the red emission layer 234 between the first charge generation layers 235a' and 235b' and the yellow-green emission layer 232c, within the second light-emitting part 232 according to another exemplary embodiment of the present invention, electrons leaking from the yellow-green emission layer 232c are trapped, and this contributes to red light emission, thereby increasing red efficiency. Hence, brightness is further improved.

The first red host with the same or similar energy level to that of the second hole transport layer may be formed of, but is not limited to, a material for the hole transport layer represented by the following formula:

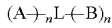

where A and B may be composed of

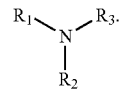

In the above formula, Rn (n=1~12) of A or B may be one among a substituted or unsubstituted aryl group with 6 to 24 carbon atoms, a substituted or unsubstituted condensed aryl group with 10 to 30 carbon atoms, a substituted or unsubstituted heteroaryl group with 2 to 24 carbon atoms, a substituted or unsubstituted alkyl group with 1 to 24 carbon atoms, a substituted or unsubstituted heteroalkyl group with 1 to 24 carbon atoms, a substituted or unsubstituted cycloalkyl group with 3 to 24 carbon atoms, a substituted or unsubstituted alkoxy group with 1 to 24 carbon atoms, a substituted or unsubstituted aryloxy group with 6 to 24 carbon atoms, a substituted or unsubstituted alkyl silyl group with 1 to 24 carbon atoms, a substituted or unsubstituted aryl silyl group with 6 to 24 carbon atoms, a cyano group, a halogen group, deuterium, and hydrogen, and R1 to R12 may form a condensed ring together with a neighboring substituent.

L is an aryl group which may be one among phenyl, naphthalene, fluorene, carbazole, phenazine, phenanthroline, phenanthridine, acridine, cinnoline, quinazoline, quinoxaline, naphthydrine, phtalazine, quinolizine, indole, indazole, pyridazine, pyrazine, pyrimidine, pyridine, pyrazole, imidazole, and pyrrole.

The first red host may include materials having the following chemical formulas:

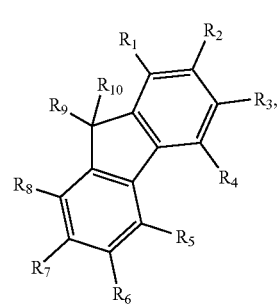

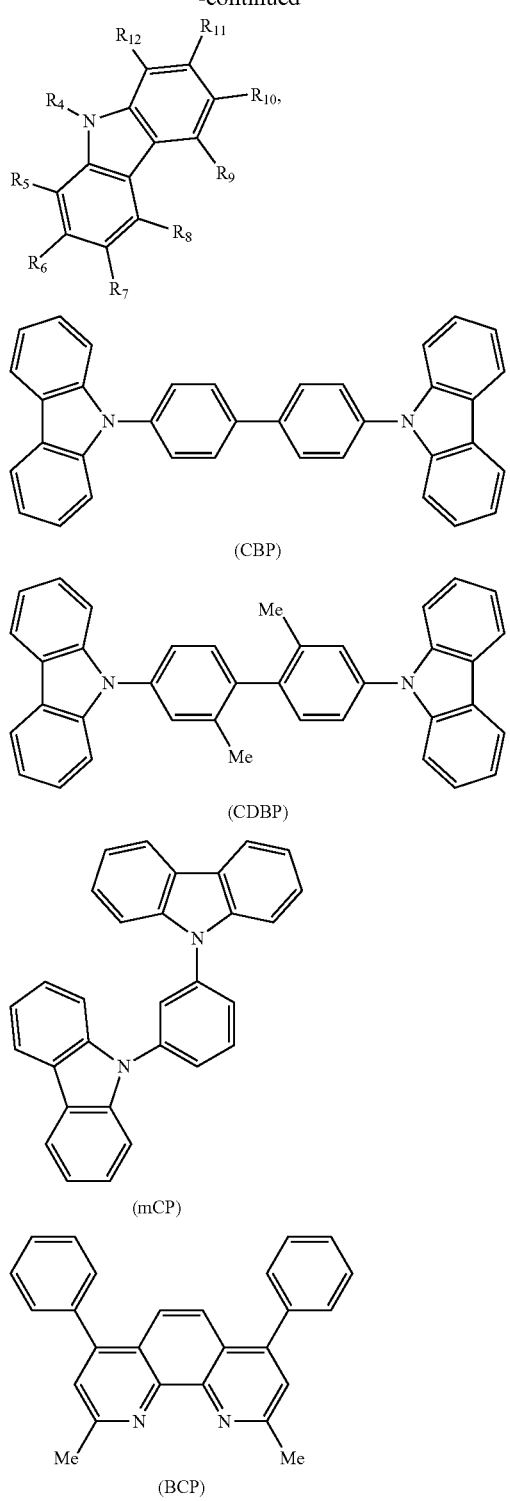

(CBP)

(CDBP)

(mCP)

(BCP)

This red emission layer 234 may include one or more hosts, i.e., a first red host, and one or more dopants.

Another host, i.e., a second red host, of the red emission layer 234 may include, but not limited to, a phosphorescent host.

The second red host may include materials having the following chemical formulas:

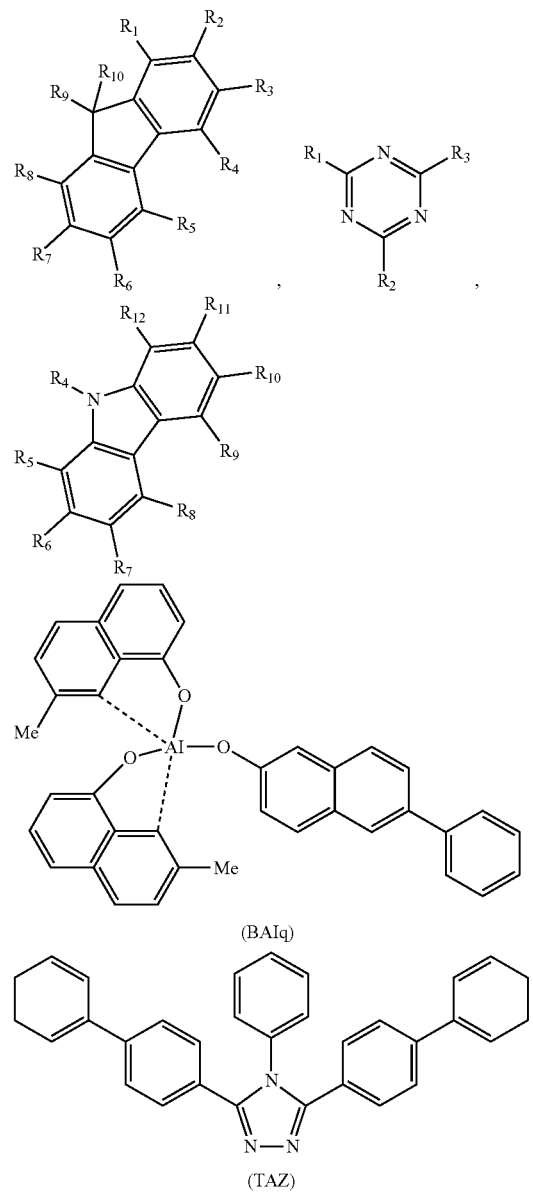

(BAlq)

(TAZ)

The phosphorescent host may include substituents such as above structures. The substituents Rn (n=1~12) may be one among a substituted or unsubstituted aryl group with 6 to 24 carbon atoms, a substituted or unsubstituted condensed aryl group with 10 to 30 carbon atoms, a substituted or unsubstituted heteroaryl group with 2 to 24 carbon atoms, a substituted or unsubstituted alkyl group with 1 to 24 carbon atoms, a substituted or unsubstituted heteroalkyl group with 1 to 24 carbon atoms, a substituted or unsubstituted cycloalkyl group with 3 to 24 carbon atoms, a substituted or unsubstituted alkoxy group with 1 to 24 carbon atoms, a substituted or unsubstituted aryloxy group with 6 to 24 carbon atoms, a substituted or unsubstituted alkyl silyl group with 1 to 24 carbon atoms, a substituted or unsubstituted aryl silyl group with 6 to 24 carbon atoms, a cyano group, a halogen group, deuterium, and hydrogen, and R1 to R12 may form a condensed ring together with a neighboring substituent.

The substituents may be a substituted or unsubstituted, fused or unfused aryl group, and may be formed by one to five multiple substitutions or non-multiple substitutions on a core structure consisting of phenyl, naphthalene, fluorene, carbazole, phenazine, phenanthroline, phenanthridine, acridine, cinnoline, quinazoline, quinoxaline, naphthydrine, phtalazine, quinolizine, indole, indazole, pyridazine, pyrazine, pyrimidine, pyridine, pyrazole, imidazole, or pyrrole.

A phosphorescent dopant may be formed of a metal compound in which three of N—N, N—O, or O—O bonds coordinate to the iridium (Ir) metal center.

The red emission layer 234 may be 5 to 300 Å thick, preferably, 50 to 150 Å thick. The red emission layer 234 may emit fluorescent or phosphorescent light. A doping concentration of a red dopant of the red emission layer 234 may range from 0.1 to 10%, preferably, 0.5 to 3%.

The auxiliary layer 236 is between the first P-type charge generation layer 225b' and the red emission layer 234, and serves to adjust a cavity between the first P-type charge generation layer 235b' and the red emission layer 234 and decrease the probability of exciton quenching, thereby contributing to nearly 100% electroluminescence.

The auxiliary layer 236 may be formed together with or separately from the red emission layer 234.

The auxiliary layer 236 may include the a hole transport-type host, which is the same type of host as the first red host of the red emission layer 234. That is, the auxiliary layer 236 may have a symmetrical or asymmetrical structure including one among the above-described structure of the first red host, but the present invention is not limited to this structure. The auxiliary layer 236 may be 10 to 300 Å thick, preferably, 10 to 150 Å thick.

Figure 17:
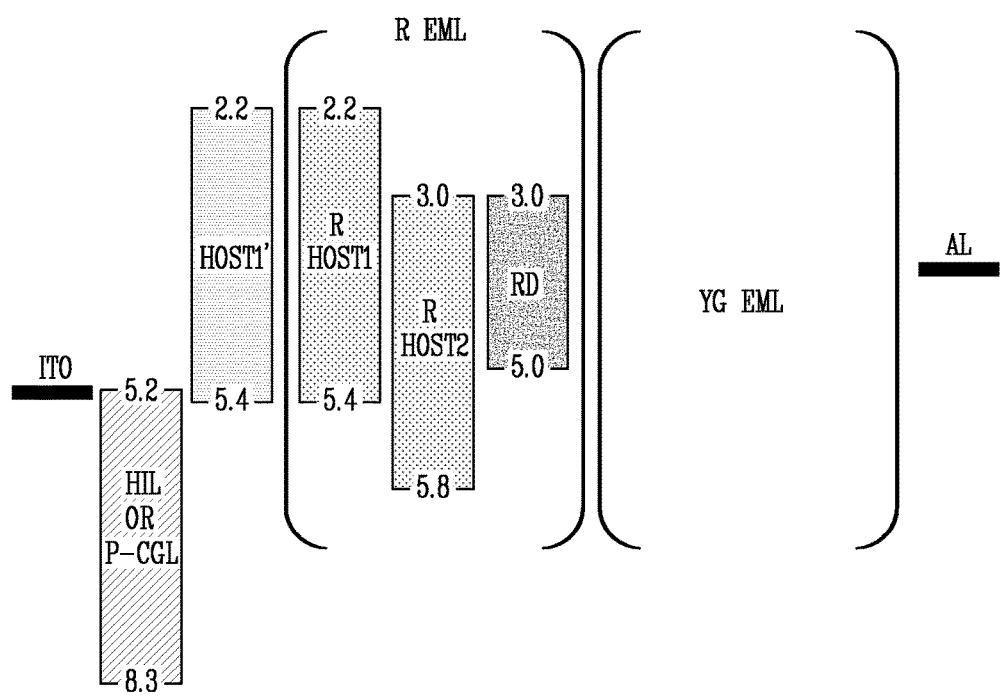
FIG. 17 is a view schematically showing a band diagram of the organic light-emitting display device according to another exemplary embodiment of the present invention.

FIG. 17 is a view schematically showing a band diagram of the organic light-emitting display device according to another exemplary embodiment of the present invention.

By way of example, FIG. 17 shows a red emission layer R EML having a first red host R HOST1, a second red host R HOST2, and a red dopant RD.

However, the present invention is not limited to this example, and the red emission layer R EML may include at least one host and at least one dopant.

Referring to FIG. 17, it can be seen that, in the red emission layer R EML according to the exemplary embodiment of the present invention, the LUMO and HOMO energy levels of the first red host R HOST1 and auxiliary layer HOST1' are 2.2 eV and 5.4 eV, respectively, which are in the same range as the second hole transport layer. However, the present invention is not limited thereto. The first red host R HOST1 is a hole transport-type host that transports holes better than electrons. Accordingly, the LUMO energy level of the first red host R HOST1 may be 1.0 to 3.0 eV, and the HOMO energy level thereof may be 4.9 to 6.0 eV. And, the LUMO energy level of the second red host R HOST2 may be 2.0 to 3.0 eV, and the HOMO energy level thereof may be 5.0 to 6.5 eV. The LUMO energy level of the auxiliary layer HOST1' may be 1.0 to 3.0 eV, and the HOMO energy level thereof may be 4.9 to 6.0 eV. As shown in FIG. 17, it can be seen that the LUMO energy level of a first P-type charge generation layer P-CGL adjoining the first red host R HOST1 is 5.2 eV and the HOMO energy level thereof is 8.3 eV. And, it can be seen that the LUMO energy level of the red dopant RD is 3.0 eV and the HOMO energy level thereof is 5.0 eV. In FIG. 17, ITO represents the first electrode, and AL represents the second electrode.

Moreover, The red emission layer R EML according to another exemplary embodiment of the present invention may function as a substitute for the second hole transport layer. That is, holes may be transferred to a yellow-green emission layer YG EML by inserting the red emission layer R EML between the first P-type charge generation layer P-CGL and the yellow-green emission layer YG EML, thereby enhancing the efficiency of the yellow-green emission layer YG EML and improving red efficiency.

As described above, in the present invention, the yellow-green emission layer YG EML of the second light-emitting part is a main emission layer, and the red emission layer R EML is an auxiliary emission layer that emits red light and also serves as the second hole transport layer. With this configuration, brightness, color gamut, and color shift rate may be improved.

That is, the red emission layer R EML functions to make up for the lack of red efficiency that is not overcome by the blue emission layer and the yellow-green emission layer YG EML alone. Also, the first red host R HOST1 and auxiliary layer HOST1' of the red emission layer R EML have the same energy level as the second hole transport layer, and may serves as a second hole transport layer that transfers holes to the overlying yellow-green emission layer YG EML by means of the first red host R HOST1, i.e, a hole transport-type host, and the auxiliary layer HOST1'. Accordingly, brightness, color gamut, and color shift rate may be further improved.

Moreover, the red dopant RD and auxiliary layer HOST1' of the red emission layer R EML may further protect the first P-type charge generation layer P-CGL by trapping electrons leaking from the yellow-green emission layer YG EML. Also, due to the presence of the auxiliary layer HOST1' and red emission layer R EML between the first P-type charge generation layers P-CGL and the yellow-green emission layer YG EML, electrons leaking from the yellow-green emission layer YG EML are trapped, and this contributes to red light emission, thereby increasing red efficiency and contributing to improvement in panel brightness.

As stated above, Comparative Example concerns an organic light-emitting diode having a 3-stack structure which includes no red emission layer.

Test Example 5 concerns an organic light-emitting diode having a 3-stack structure which includes a red emission layer according to another exemplary embodiment of the present invention, in which case the first red host and the second red host are 50 Å thick. In this case, the first red host is a hole transport-type host with the same or similar energy level to that of the above-explained hole transport layer.

In Test Example 5, the red dopant of the red emission layer has a 1% doping concentration, and the red emission layer includes an auxiliary layer composed of the above-described first red host.

Test Example 5 shows that the amount of variation (Δu'v') in chromaticity coordinates is about 0.008 when the viewing angle changes from 0° to 60°. The DCI coverage measured was 98%. DCI coverage may be said to be a DCI color gamut satisfaction level. This wide DCI coverage provides a higher picture quality in large-size televisions or the like. This indicates that Test Example 5 had a further improvement in color shift rate and color gamut by the addition of the red emission layer and the auxiliary layer, as compared to Comparative Example and Test Examples 1 to 4. Also, this indicates that Test Example 5 had a further improvement in red efficiency as compared to Comparative Example and Test Examples 1 to 4. Test Example 6 concerns an organic light-emitting diode having a 3-stack structure which includes a red emission layer according to another exemplary embodiment of the present invention, in which case the first red host and the second red host are 70 Å and 50 Å thick, respectively. In this case, the first red host is a hole transport-type host with the same or similar energy level to that of the above-explained hole transport layer.

In Test Example 6, the red dopant of the red emission layer has a 1% doping concentration, and the red emission layer includes an auxiliary layer composed of the above-described first red host.

Test Example 6 shows that the amount of variation (Δu'v') in chromaticity coordinates is about 0.014 when the viewing angle changes from 0° to 60°. The DCI coverage measured was 99%. DCI coverage may be said to be a DCI color gamut satisfaction level. This wide DCI coverage provides a higher picture quality in large-size televisions or the like. This indicates that Test Example 6 had a further improvement in color shift rate and color gamut by the addition of the red emission layer and the auxiliary layer, as compared to Comparative Example and Test Examples 1 to 4. Also, this indicates that Test Example 6 had a further improvement in red efficiency as compared to Comparative Example and Test Examples 1 to 4.

It will be apparent to those skilled in the art that various modifications and variations can be made in the organic light-emitting diode display device and method of fabricating the same of the present invention without departing from the spirit or scope of the invention. Thus, it is intended that the present invention cover the modifications and variations of this invention provided they come within the scope of the appended claims and their equivalents.

What is claimed is:

1. A white organic light-emitting display device, comprising:
    a first light-emitting part over a first electrode and including a blue emission layer;
    a first charge generation layer over the first light-emitting part;
    a second light-emitting part over and contacting the first charge generation layer, the second light-emitting part including a red emission layer on the first charge generation layer without a hole transport layer or a buffer layer in between, and a yellow-green emission layer on the red emission layer; and
    a second electrode over the second light-emitting part,
    wherein the red emission layer includes a first red host, a second red host, and one or more dopants,
    wherein the first red host is at least one hole transport-type host with a hole transport property, and the at least one hole transport-type host functions as a hole transport layer,
    wherein the second red host is at least one electron transport-type host with an electron transport property,
    wherein the first red host has a lowest unoccupied molecular orbital (LUMO) energy level of 1.0 to 3.0 eV, and has a highest occupied molecular orbital (HOMO) energy level of 4.9 to 6.0 eV, and
    wherein the second red host has a LUMO energy level of 2.0 to 3.0 eV, and has a HOMO energy level of 5.0 to 6.5 eV.

2. The display device of claim 1, further comprising a third light-emitting part over the second light-emitting part, the third light-emitting part including a blue emission layer.

3. The display device of claim 2, further comprising a second charge generation layer between the second light-emitting part and the third light-emitting part.

4. The display device of claim 2, wherein the third light-emitting part includes a third hole transport layer and a third electron transport layer.

5. The display device of claim 1, wherein the first light-emitting part further includes a first hole transport layer between the first electrode and the blue emission layer, and a first electron transport layer between the blue emission layer and the first charge generation layer, and
    the second light-emitting part further includes a second electron transport layer between the yellow-green emission layer and the second electrode.

6. The display device of claim 1, wherein the red emission layer is over the first charge generation layer and the yellow-green emission layer is on the red emission layer.

7. The display device of claim 1, wherein the one or more dopants include a red dopant with a doping concentration of 0.5 to 10%.

8. The display device of claim 1, wherein a thickness ratio of a hole transport-type host layer of the at least one hole transport-type host and a host layer of the at least one electron transport-type host is between 0:1 to 1:0.

9. A white organic light-emitting display device, comprising:
    a first light-emitting part over a first electrode, the first light-emitting part including a first hole transport layer, a first emission layer, and a first electron transport layer;
    a first charge generation layer over the first light-emitting part;
    a second light-emitting part over the first light-emitting part, the second light-emitting part including a second emission layer with a hole transport function and a second electron transport layer,
    wherein the second emission layer is provided on the first charge generation layer without a hole transport layer or a buffer layer in between;
    a third light-emitting part over the second light-emitting part, the third light-emitting part including a second hole transport layer, a third emission layer, and a third electron transport layer; and
    a second electrode over the third light-emitting part,
    wherein the second emission layer comprises two emission layers, the two emission layers having a red emission layer on the first charge generation layer and a yellow-green emission layer on the red emission layer,
    wherein the red emission layer includes a first red host, a second red host, and one or more dopants,
    wherein the first red host is at least one hole transport-type host with a hole transport property, and the at least one hole transport-type host functions as a hole transport layer,
    wherein the second red host is at least one electron transport-type host with an electron transport property,
    wherein the first red host has a lowest unoccupied molecular orbital (LUMO) energy level of 1.0 to 3.0 eV, and has a highest occupied molecular orbital (HOMO) energy level of 4.9 to 6.0 eV, and
    wherein the second red host has a LUMO energy level of 2.0 to 3.0 eV, and has a HOMO energy level of 5.0 to 6.5 eV.

10. The display device of claim 9, wherein the red emission layer has a hole transport function, and the second light-emitting part has no hole transport layer.

11. The display device of claim 9, further comprising a second charge generation layer between the second light-emitting part and the third light-emitting part.

12. The display device of claim 9, wherein the one or more dopants include a red dopant with a doping concentration of 0.5 to 10%.

* * * * *